United States Patent [19]
Kimura

[11] Patent Number: 6,111,463
[45] Date of Patent: Aug. 29, 2000

[54] OPERATIONAL TRANSCONDUCTANCE AMPLIFIER AND MULTIPLIER

[75] Inventor: Katsuji Kimura, Tokyo, Japan

[73] Assignee: NEC Corporation, Tokyo, Japan

[21] Appl. No.: 08/808,561

[22] Filed: Feb. 28, 1997

[30] Foreign Application Priority Data

Feb. 29, 1996 [JP] Japan ................................. 8-069378

[51] Int. Cl.$^7$ ................................................. H03F 3/45
[52] U.S. Cl. ........................ 330/254; 327/359; 330/257
[58] Field of Search .................................. 330/252, 253, 330/254, 257; 327/359

[56] References Cited

U.S. PATENT DOCUMENTS

| | | | |
|---|---|---|---|
| 4,498,053 | 2/1985 | Katakura et al. | 330/261 |
| 4,783,602 | 11/1988 | Viswanathan | 330/257 X |
| 5,107,150 | 4/1992 | Kimura | 307/529 |
| 5,157,350 | 10/1992 | Rubens | 330/254 |
| 5,187,682 | 2/1993 | Kimura | 364/841 |
| 5,212,855 | 5/1993 | McGanty | 24/580 |
| 5,381,113 | 1/1995 | Kimura | 330/253 |
| 5,438,296 | 8/1995 | Kimura | 327/560 |
| 5,481,224 | 1/1996 | Kimura | 330/253 |
| 5,485,119 | 1/1996 | Kimura | 330/253 |
| 5,500,623 | 3/1996 | Kimura | 330/252 |
| 5,521,542 | 5/1996 | Kimura | 327/352 |
| 5,523,717 | 6/1996 | Kimura | 330/252 |
| 5,552,734 | 9/1996 | Kimura | 327/356 |
| 5,552,742 | 9/1996 | Perkins | 330/252 X |
| 5,561,392 | 10/1996 | Kimura | 327/350 |
| 5,578,965 | 11/1996 | Kimura | 330/254 |
| 5,581,210 | 12/1996 | Kimura | 327/355 |
| 5,581,211 | 12/1996 | Kimura | 327/356 |
| 5,602,509 | 2/1997 | Kimura | 330/253 |
| 5,617,052 | 4/1997 | Kimura | 327/356 |
| 5,631,594 | 5/1997 | Kimura | 327/351 |
| 5,640,121 | 6/1997 | Kimura | 327/359 |
| 5,668,750 | 9/1997 | Kimura | 364/841 |
| 5,712,810 | 1/1998 | Kimura | 364/841 |

FOREIGN PATENT DOCUMENTS

| | | |
|---|---|---|
| 58-9409 | 1/1983 | Japan . |
| 62-161204 | 7/1987 | Japan . |

OTHER PUBLICATIONS

A Precise Four–Quadrant Multiplier With Subnanosecond Response, by Gilbert, IEEE Journal of Solid–State Circuits, vol. SC–3, No. 4, Dec. 1968, pp 365–373.

Precision Differential Voltage–Current Convertor by Caprio; Electronics Letters, Mar. 22, 1973, vol. 9, No. 6.

A. 2.5–V Active Low–Pass Filter Using All–n–p–n Gilbert Cells with a 1–V$_{p-p}$ Linear Input Range, by Koyama et al.; IEEE Journal of Solid–State Circuits, vol. 28, No. 12, Dec. 1993, pp 1246–53.

Low Voltage Type Bipolar–OTA, by Hirota et al.; Faculty of Science and Technology, Science University of Tokyo, 1994, p. 12.

*Primary Examiner*—Steven J. Mottola
*Attorney, Agent, or Firm*—Sughrue, Mion, Zinn, Macpeak & Seas, PLLC

[57] ABSTRACT

An OTA capable of completely linear operation within the entire operable input range is provided. This OTA includes a differential pair of first and second bipolar transistors, a first current source/sink for driving the first transistor, a second current source/sink for driving the second transistor, and a resistor connected to an emitter of the first transistor and an emitter of the second transistor. The emitters of the first and second transistors are coupled together through the resistor. The differential pair has a pair of input terminals of the OTA. A first current mirror having an input terminal and an output terminal and a second current mirror having an input terminal and an output terminal are provided. The input terminal of the first current mirror is connected to the first transistor. The input terminal of the second current mirror is connected to the second transistor. The output terminal of the first current mirror and the output terminal of the second current mirror form a pair of output terminals of the OTA. An input signal to be amplified is differentially applied across the pair of input terminals of the OTA. An amplified output signal is differentially derived from the pair of output terminals of the OTA.

10 Claims, 14 Drawing Sheets

OPERATIONAL TRANSCONDUCTANCE AMPLIFIER AND MULTIPLIER

BACKGROUND OF THE INVENTION

1. Field of the Invention

The present invention relates to a differential amplifier circuit comprised of bipolar transistors or Metal-Oxide-Semiconductor Field-Effect Transistors (MOSFETs) and more particularly, to a differential amplifier circuit having an improved transconductance linearity within a wide input voltage range, and a multiplier using the differential amplifier circuit, which are formed on a bipolar or MOS semiconductor integrated circuit device (IC) and is operable at a supply voltage as low as approximately 1.9 V.

2. Description of the Prior Art

A differential amplifier circuit having a superior transconductance linearity within a comparatively wide input voltage range has been known as an "Operational Transconductance Amplifier (OTA)".

A first conventional bipolar OTA is shown in FIG. 1, which is termed "Gilbert gain cell". This OTA was disclosed in IEEE Journal of Solid-State Circuits, Vol. SC-3, No. 4, pp. 353–365, December, 1968, entitled "A Precise Four-Quadrant Analog Multiplier with Subnanosecond Response", and written by B. Gilbert.

As shown in FIG. 1, the "Gilbert gain cell" includes first and second balanced differential pairs. The first differential pair is composed of npn bipolar transistors Q101 and Q102. The second differential pair is composed of npn bipolar transistors Q105 and Q106.

In the first differential pair, an emitter of the transistor Q101 is connected to one end of a constant current sink sinking a constant current $I_0$. An emitter of the transistor Q102 is connected to one end of another constant current sink sinking the same constant current $I_0$ as that of the sink for the transistor Q101. The other ends of the two current sinks are connected to the ground. The transistors Q101 and Q102 are driven by the corresponding current sinks, respectively.

The emitters of the transistors Q101 and Q102 are connected to each other through an emitter resistor R101 having a resistance R.

Bases of the transistors Q101 and Q102 are connected to a pair of input terminals, respectively. A differential input voltage $V_i$ as an input signal of the first conventional OTA of FIG. 1 is applied across the bases of the transistors Q101 and Q102 through the pair of input terminals.

Two diode-connected npn bipolar transistors Q103 and Q104 are provided as loads of the corresponding transistors Q101 and Q102, respectively. Specifically, collectors of the transistors Q101 and Q102 are connected to emitters of the transistors Q103 and Q104, respectively. A base and a collector of the transistor Q103 are coupled together to be applied with a power supply voltage $V_{CC}$. A base and a collector of the transistor Q104 are coupled together to be connected to be applied with the same power supply voltage $V_{CC}$.

In the second differential pair composed of the transistors Q105 and Q106, emitters of the transistors Q105 and Q106 are coupled together to be connected to one end of a common constant current sink sinking a constant current $I_1$. The other end of the current sink is grounded. No emitter resistor is provided for the transistors Q105 and Q106.

Bases of the transistors Q105 and Q106 are connected to the collectors of the transistors Q102 and Q101, respectively.

A differential output current $\Delta I_C$ as an amplified output signal of the conventional OTA (i.e., the Gilbert gain cell) is defined as the difference between collector currents $I_C^+$ and $I_C^-$ of the transistors Q105 and Q106. Therefore, the output current $\Delta I_C$ is expressed as $\Delta I_C = I_C^+ - I_C^-$. The output current $\Delta I_C$ is differentially derived from the collectors of the transistors Q105 and Q106.

In the first differential pair, the difference between collector currents of the transistors Q101 and Q102 is converted to the voltages through the diode-connected load transistors Q103 and Q104. Through this current-to-voltage conversion, the difference of the collector currents of the transistors Q101 and Q102 is logarithmically compressed.

The converted voltages thus obtained are derived from the emitters of the load transistors Q103 and Q104, and then applied across the bases of the transistors Q105 and Q106 in the second differential pair. The second differential pair differentially amplifies the applied voltages and output the differential output current $\Delta I_C$ at the collectors of the transistors Q105 and Q106.

Next, the operation of the conventional Gilbert gain cell of FIG. 1 is explained in detail below.

Here, supposing that the base-width modulation (i.e., the Early voltage) is ignored, a collector current $I_C$ of a bipolar transistor is typically expressed as the following equation (1)

$$I_C = I_S \exp\left(\frac{V_{BE}}{V_T}\right) \tag{1}$$

In the equation (1), $V_{BE}$ is the base-to-emitter voltage of the transistor, and $I_S$ is the saturation current thereof. $V_T$ is the thermal voltage defined as $V_T = kT/q$, where k is the Boltzmann's constant, T is absolute temperature in degrees Kelvin, and q is the charge of an electron.

In the following analysis, for the sake of simplification, it is supposed that the common-base current gain factor of the transistor is approximately equal to unity and therefore, the base current can be ignored.

When the differential input voltage $V_i$ is applied across the bases of the transistors Q101 and Q102 in the first differential pair, the following equation (2) is established around the loop consisting of the input voltage and the two base-emitter junctions because of the Kirchhoff's voltage law.

$$V_{IN} = V_{BE1} - V_{BE2} + Ri \tag{2}$$

In the equation (2), $V_{BE1}$ and $V_{BE2}$ are the base-to-emitter voltages of the transistors Q101 and Q102, and i is a current flowing through the emitter resistor R101.

Supposing that $R\,i \gg V_{BE1} - V_{BE2}$ is established, the current i is expressed as the following equation (3).

$$i = \frac{V_{IN} - (V_{BE1} - V_{BE2})}{R} \approx \frac{V_{IN}}{R} \tag{3}$$

The current i flowing through the emitter resistor R101 further flows through the diode-connected transistors Q103 and Q104 as a differential current, resulting in a differential output voltage $V_0$ between the emitters of the transistors Q103 and Q104 (or, collectors of the transistors Q101 and Q102).

The differential output voltage $V_0$ of the first differential pair is expressed by the following equation (3a) as $$V_O = V_T \ln\left(\frac{i}{I_S}\right) \qquad (3a)$$

It is seen from the equation (3a) that the output voltage $V_O$ is in a logarithmically compressed form of the current i. This means that the voltage $V_O$ is logarithically proportional to the current i.

The differential output voltage $V_O$ is then applied across the bases of the transistors Q105 and Q106 to be amplified, resulting in the differential output current $\Delta I_C$ as an amplified output signal of $V_O$.

Typically, in a balanced differential pair of two bipolar transistors having no emitter resistor, a differential output current is approximately, exponentially proportional to a differential input voltage. Accordingly, the differential output current $\Delta I_C$ is in an exponentially expanded form of the differential output voltage $V_O$.

Thus, the output current $\Delta I_C$ is proportional to the current i flowing through the emitter resistor R101. This means that the current i can be derived from the collectors of the transistors Q105 and Q106 (i.e., the output terminals).

With the conventional Gilbert gain cell shown in FIG. 1, however, a problem that a complete linear behavior cannot be realized occurs, because it contains the approximation as shown in the above equation (3). Satisfactory linearity in the OTA behavior can be realized only when the value of the resistance R of the emitter resistor R101 and the values of the constant currents $I_0$ and $I_1$ are suitably designed.

The conventional Gilbert gain cell of FIG. 1 has another problem that the signal-to-noise ratio (S/N) is remarkably degraded. This is because the input signal $V_i$ is logarithmically compressed and then, exponentially expanded.

A second conventional bipolar OTA is shown in FIG. 2, which is termed the "Caprio's quad", and realizes the approximately, completely linear behavior. This OTA was disclosed in IEE Electronics Letters, 22nd Mar. 1973, Vol. 9, No. 6, pp. 147–148, entitled "Precision Differential Voltage-Current Converter", and written by R. Caprio.

As shown in FIG. 2, four npn bipolar transistors Tr1, Tr2, Tr3, and Tr4 are connected in cascode. Specifically, an input voltage V is applied across bases of the transistor Tr1 and Tr3 with the polarity shown in FIG. 2. Output currents $I_{C1}$ and $I_{C3}$ of the OTA of FIG. 2 are derived from collectors of the transistors Tr1 and Tr3.

An emitter of the transistor Tr1 is connected to a base of the transistor Tr4 and a collector of the transistor Tr2. An emitter of the transistor Tr3 is connected to a base of the transistor Tr2 and a collector of the transistor Tr4.

An emitter of the transistor Tr2 is connected to one end of a constant current sink sinking a constant current ($I_0/2$). An emitter of the transistor Tr4 is connected to one end of another constant current sink sinking the same constant current ($I_0/2$). An emitter resistor with a resistance $R_E$ is connected to the emitters of the transistors Tr2 and Tr4.

The operation of the conventional OTA termed the "Caprio's quad" in FIG. 2 is as follows;

Since the transistors Tr1 and Tr2 are cascode-connected and the transistors Tr3 and Tr4 are also cascode-connected, the following equations (4) and (5) are established.

$$V_{BE1} = V_{BE2} \qquad (4)$$

$$V_{BE3} = V_{BE4} \qquad (5)$$

In the equations (4) and (5), $V_{BE1}$, $V_{BE2}$, $V_{BE3}$, and $V_{BE4}$ are the base-to-emitter voltages of the transistors Tr1, Tr2, Tr3, and Tr4, respectively.

Here, the positive and negative voltage shifts of the input voltage V, which are generated by the transistors Tr1, Tr2, Tr3, and Tr4, are defined as $V_S^+$ and $V_S^-$, respectively. Since the bases and collectors of the transistors Tr2 and Tr4 are cross-coupled, the positive and negative voltage shifts $V_S^+$ and $V_S^-$ are equal to each other, and expressed as the following equation (6).

$$V_S^+ = V_{BE3} + V_{BE2} = V_{BE1} + V_{BE4} = V_S^- \qquad (6)$$

Therefore, the voltages $V_S^+$ and $V_S^-$ applied to the emitter resistor is equal in magnitude and opposite in polarity to the input voltage V.

Accordingly, the following equation (7) is established.

$$V = R_E i \qquad (7)$$

The output currents $I_{C1}$ and $I_{C3}$ are given by the following equations (8) and (9), respectively.

$$I_{C1} = \frac{I_0}{2} - \frac{V}{R_E} \qquad (8)$$

$$I_{C3} = \frac{I_0}{2} + \frac{V}{R_E} \qquad (9)$$

From the equations (8) and (9), the differential output current $\Delta I$, which is defined as $\Delta I = (I_{C1} - I_{C3})$, is $(-2V/R_E)$. Thus, the differential output current $\Delta I$ is opposite in polarity to the input voltage V.

The conventional OTA termed the "Caprio's quad" in FIG. 2 has a problem that the differential output current $\Delta I$ is opposite in polarity to the input voltage V.

Another problem of the "Caprio's quad" is that the maximum value of the input voltage V is as low as approximately ±400 mV. This is because the transistors Tr2 and Tr4 will saturate if the input voltage V is large.

A further problem of the "Caprio's quad" is that the power supply voltage is not decreased, because the transistors Tr1, Tr2, Tr3, and Tr4 are cascode-connected in two stages.

A third conventional bipolar OTA is shown in FIG. 3, which is termed the "Gilbert-cell transconductor". This OTA was disclosed in IEEE Journal of Solid-State Circuits, Vol. 28, No. 12, pp. 1246–1253, December, 1993, entitled "A 2.5-V Active Low-Pass Filter Using All n-p-n Gilbert Cells with a 1-$V_{P-P}$ Linear Input Range", and written by M. Koyama et al.

In FIG. 3, a first balanced differential pair of npn-bipolar transistors Q201 and Q202 serves as a voltage-to-current (V-I) converter. A second balanced differential pair of npn-bipolar transistors Q203 and Q204 serves as an arc hyperbolic tangent function (tanh$^{-1}$) circuit. A third balanced differential pair of npn-bipolar transistors Q205 and Q206 serves as a hyperbolic tangent function (tanh) circuit.

A differential input voltage $V_{id}$ is applied across bases of the transistors Q201 and Q202. An emitter resistor R201 with a resistance $R_{EE}$ is connected to emitters of the transistors Q201 and Q202. A current i flows through the resistor R201. The emitter of the transistor Q201 is connected to a collector of the transistor Q203. The emitter of the transistor Q202 is connected to a collector of the transistor Q204.

A collector of the transistor Q201 is applied with a power supply voltage $V_{CC}$ through a constant current source supplying a constant current ($I_1/2$). A collector of the transistor Q202 is applied with the power supply voltage $V_{CC}$ through another constant current source supplying the same constant current ($I_1/2$).

The collector of the transistor Q201 is further connected to a base of the transistor Q203 through a constant voltage source supplying a constant voltage $V_{LS}$. Similarly, the collector of the transistor Q202 is further connected to a base of the transistor Q204 through another constant voltage source supplying the same constant voltage $V_{LS}$. The two voltage sources serve to shift the voltage level at the bases of the transistors Q203 and Q204.

Emitters of the transistors Q203 and Q204 are coupled together to be connected to the ground through an emitter resistor R202.

In the third differential pair, bases of the transistors Q205 and Q206 are connected to the bases of the transistors Q204 and Q203 of the second transistor pair, respectively. The bases of the transistors Q205 and Q206 are applied with the voltage difference between the base voltages of the transistors Q203 and Q204, i.e., $\Delta V_i$. The voltage $\Delta V_i$ is proportional to the arc hyperbolic tangent of the current i, i.e., $(\tanh^{-1} i)$.

Emitters of the transistors Q205 and Q206 are coupled together to be connected to the ground through a constant current sink sinking a constant current $I_2$. Collectors of the transistors Q205 and Q206 are applied with the power supply voltage $V_{CC}$ through corresponding constant current sources supplying the same constant current $(I_2/2)$.

Output currents $I_{O1}$ and $I_{O2}$ are differentially derived from the collectors of the transistors Q205 and Q206, respectively. The differential output current $\Delta I_0$ is proportional to the hyperbolic tangent of the input voltage $\Delta V_1$, i.e., $(\tanh \Delta V_i)$.

With the third conventional OTA termed the "Gilbert-cell transconductor" in FIG. 3, the transistors Q201 and Q202 of the first differential pair are driven by the constant currents with the same current value $(I_1/2)$, respectively. Therefore, the base-to-emitter voltages $V_{BE1}$ and $V_{BE2}$ of the transistors Q201 and Q202 are equal. Thus, $$V_{BE1}=V_{BE2} \quad (10)$$

is established.

The voltage applied to the emitter resistor R201 of the transistors Q201 and Q202 is equal to the input voltage $V_{id}$. That is, $$V_{id}=iR_{EE} \quad (11)$$

is established.

Therefore, the output currents $I_{C3}$ and $I_{C4}$ of the second differential pair of the transistors Q203 and Q204 are expressed as the following equations (12) and (13), respectively.

$$I_{C3} = \frac{I_0}{2} - \frac{V_{id}}{R_{EE}} \quad (12)$$

$$I_{C4} = \frac{I_0}{2} + \frac{V_{id}}{R_{EE}} \quad (13)$$

It is seen from the equations (12) and (13) that the current $I_{C3}$ decreases as the input voltage $V_{id}$ increases, and that the current $I_{C4}$ increases as the input voltage $V_{id}$ increases.

The second differential pair of the transistors Q203 and Q204 serves as the arc hyperbolic tangent function $(\tanh^{-1})$ circuit. If the differential output current $\Delta I_0$ is defined as the difference between the currents $I_{C3}$ and $I_{C4}$, i.e., $\Delta I_0 = I_{C3} - I_{C4}$, the differential voltage $\Delta V_i$ is expressed as $\Delta V_1 = \tanh^{-1}(\Delta I_0)$.

Further, the third balanced differential pair of the transistors Q205 and Q206 serves as the hyperbolic tangent function $(\tanh)$ circuit. Accordingly, $\Delta I_0 = \tanh(\Delta V_i)$ is established.

As a result, the arc hyperbolic tangent function of the second differential pair of the transistors Q203 and Q204 cancels the hyperbolic tangent function of the third differential pair of the transistors Q205 and Q206. Thus, the linear operation is obtained.

The relationship or polarity of the currents $I_{C3}$ and $I_{C4}$ with the input voltage $V_{id}$ is adjusted by replacing the connections of the transistors Q203 and Q204 to the transistors Q205 and Q206.

The conventional OTA of FIG. 3 termed the "Gilbert Gain Cell" has a problem that large degradation in S/N occurs because of the logarithmically compression with the use of the function $(\tanh^{-1})$ and exponentially expansion with the use of the function $(\tanh)$.

Another problem of the conventional OTA of FIG. 3 is that the power supply voltage cannot be reduced due to the existence of the $(\tanh^{-1})$ and $(\tanh)$ function circuits.

To improve the conventional Gilbert gain cell to thereby realize the complete linearity in the OTA behavior, a fourth conventional bipolar OTA is shown in FIG. 4, which was developed to improve the conventional Gilbert gain cell of FIG. 1. This OTA was disclosed in Proceedings of the 1994 IEICE fall conference, No. A-12, entitled "Low-Voltage Operable Bipolar OTA", written by M. Hirota et al.

The fourth conventional bipolar OTA of FIG. 4 seems to be able to realize the complete linearity in the OTA behavior.

As shown in FIG. 4, a first differential pair is composed of npn bipolar transistors Q301 and Q302. An emitter of the transistor Q301 is connected to one end of a constant current sink sinking a constant current $I_1$. An emitter of the transistor Q302 is connected to one end of another constant current sink sinking the same constant current $I_1$ as that of the sink for the transistor Q301. The other ends of the two current sinks are connected to the ground. The transistors Q301 and Q302 are driven by the corresponding current sinks, respectively.

The emitters of the transistors Q301 and Q302 are connected to each other through an emitter resistor R301 having a resistance R.

Bases of the transistors Q301 and Q302 are connected to a pair of input terminals T201 and T202, respectively.

An input voltage $(V_{IN}/2)$ is applied to the base of the transistor Q301. Another input voltage $(-V_{IN}/2)$ is applied to the base of the transistor Q302.

Two constant current sources supplying the same constant current $2I_0$ are provided for loads of the respective transistors Q301 and Q302. Collectors of the transistor Q301 and Q302 are connected to ends of the corresponding current sources, respectively.

A second differential pair is composed of npn bipolar transistors Q303 and Q304. Emitters of the transistors Q303 and Q304 are connected to each other through an emitter resistor R302 having the same resistance R as that of the resistor R301. Collectors of the transistors Q303 and Q304 are applied with a power supply voltage $V_{CC}$ through corresponding current sources supplying the same constant current $2I_1$, respectively. Bases of the transistors Q303 and Q304 are commonly connected to a positive end of a constant voltage source supplying a dc constant voltage $V_{bias}$.

A third differential pair is composed of npn bipolar transistors Q305 and Q306. Emitters of the transistors Q305 and Q306 are directly coupled together to be connected to the ground through a resistor R303. Collectors of the transistors Q305 and Q306 are connected to the emitters of the transistors Q303 and Q304, respectively.

An npn transistor Q307 and a constant current source supplying a constant current $I_3$ are provided for the transistor Q305. An emitter of the transistor Q307 is connected to the ground through this current source. A collector of the transistor Q307 is applied with the power supply voltage $V_{CC}$. A base of the transistor Q307 is connected to the collector of the transistor Q303.

Similarly, an npn transistor Q308 and a constant current source supplying the same constant current $I_3$ as that of the current source for the transistor Q307 are provided for the transistor Q306. An emitter of the transistor Q308 is connected to the ground through this current source. A collector of the transistor Q308 is applied with the power supply voltage $V_{CC}$. A base of the transistor Q308 is connected to the collector of the transistor Q304.

The transistors Q307 and its corresponding constant current sink sinking the current $I_3$ have a function of level-shifting the current flowing through the transistor Q305. The transistors Q308 and its corresponding constant current sink sinking the current $I_3$ have a function of level-shifting the current flowing through the transistor Q306.

The two constant current sources supplying the same constant current $2I_1$, which serve as the loads of the respective transistors Q301 and Q302, commonly serve as loads of the respective transistors Q303 and Q304.

A fourth differential pair is composed of npn bipolar transistors Q309 and Q310. Emitters of the transistors Q309 and Q310 are coupled together to be connected to the ground through a constant current sink sinking a constant current $2I_2$. Collectors of the transistors Q309 and Q310 are applied with the supply voltage $V_{CC}$ through corresponding current sources supplying the same constant current $I_2$, respectively.

Output currents $I_{OUT1}$ and $I_{OUT2}$ are differentially derived from the collectors of the transistors Q309 and Q310, respectively, resulting in a differential output current $\Delta I_{OUT}$ as an amplified output signal of the conventional OTA of FIG. 4, which is defined as $\Delta I_{OUT}=I_{OUT1}-I_{OUT2}$.

The first differential pair including the resistor R301 constitutes an input circuit. The second and third differential pairs including the resistor R302 constitute a non-linearity compensation circuit for compensating the non-linearity of the differential input voltage $V_{IN}$. The fourth differential pair constitutes an output circuit.

Next, the operation of the conventional OTA of FIG. 4 is explained below.

When the differential input voltage $V_{IN}$ is applied across the bases of the transistors Q301 and Q302 of the first differential pair, the following equation (14) is established around the loop consisting of the input voltage and the two base-emitter junctions because of the Kirchhoff's voltage law $$V_{IN}=V_{BE1}-V_{BE2}+Ri_R \quad (14)$$

where $V_{BE1}$ and $V_{BE2}$ are the base-to-emitter voltages of the transistors Q301 and Q302, and $i_R$ is a current flowing through the emitter resistor R301.

From the equation (14), the current $i_R$ is expressed by the following equation as $$i_R = \frac{V_{IN} - (V_{BE1} - V_{BE2})}{R} \quad (15)$$

In this conventional OTA shown in FIG. 4, the two current sources supplying the same current $2I_1$ are commonly used as the loads for the first differential pair of the transistors Q301 and Q302 and the second differential pair of the transistors Q303 and Q304. Therefore, the collector currents of the transistors Q301 and Q303 are equal and as a result, the base-to-emitter voltages $V_{BE1}$ and $V_{BE3}$ are equal.

Similarly, the collector currents of the transistors Q302 and Q304 are equal and as a result, the base-to-emitter voltages $V_{BE2}$ and $V_{BE4}$ are equal.

Since the emitter resistor R302 for the transistors Q303 and Q304 has the same resistance value R as that of the resistor R301, a current $i_R'$ flowing through the resistor R302 can be expressed as the following equation (16).

$$i_R' = \frac{V_{BE4} - V_{BE3}}{R} \quad (16)$$
$$= -\frac{V_{BE1} - V_{BE2}}{R}$$

Accordingly, currents $I_5$ and $I_6$ flowing through the transistors Q305 and Q306 can be obtained as the following equations (17) and (18), respectively.

$$I_5 = I_1 + i_R - i_R' = I_1 + \frac{V_{IN}}{R} \quad (17)$$

$$I_6 = I_1 - i_R + i_R' = I_1 - \frac{V_{IN}}{R} \quad (18)$$

It is seen from the equations (17) and (18) that an output voltage $V_O$ between the bases of the transistors Q305 and Q306 is proportional to a differential current defined as $(I_5-I_6)=(2V_{IN}/R)$.

The output voltage is inputted into the fourth differential pair of the transistors Q307 and Q308 and therefore, a differential output current $\Delta I_{OUT}$ ($=I_{OUT1}-I_{OUT2}$), which is derived from the collectors of the transistors Q307 and Q308 and is proportional to $(2V_{IN}/R)$, can be obtained.

Since the current $i_R'$ flowing through the emitter resistor R302 shown by the equation (16) is supplied from the transistors Q303 and Q304, the equation (16) is established only under the condition that both of the currents flowing through the transistors Q303 and Q304 are greater than the value of $[(V_{BE4}-V_{BE3})/R]$.

This means that conventional bipolar OTA of FIG. 4 does not realize a completely linear OTA behavior.

Also, this OTA has the same problem as in the Gilbert gain cell that the signal-to-noise ratio (S/N) is remarkably degraded.

FIG. 5 shows the well-known Gilbert multiplier cell.

In FIG. 5, npn bipolar transistors Q401 and Q402 form a first emitter-coupled differential pair, npn bipolar transistors Q403 and Q404 form a second emitter-coupled differential pair, and npn bipolar transistors Q405 and Q406 form a third emitter-coupled differential pair.

Collectors of the transistors Q401, Q402, Q403 and Q404 are cross-coupled. A collector of the transistor Q405 is connected to the coupled emitters of the transistors Q401 and Q402. A collector of the transistor Q406 is connected to the coupled emitters of the transistors Q403 and Q404. The coupled emitters of the transistors Q405 and Q406 are connected to a constant current sink sinking a constant current $I_0$. Bases of the transistors Q401 and Q404 are coupled together. Bases of the transistors Q402 and Q403 are also coupled together.

A first input voltage $V_x$ is applied across the coupled bases of the transistors Q401 and Q404 and those of the transistors Q402 and Q403. A second input voltage $V_y$ is applied across the bases of the transistors Q405 and Q406.

The third differential pair of the transistors Q405 and Q406 and the corresponding constant current sink constitute a differential voltage-current converter.

A collector current of the transistor Q405 is expressed as [$(I_0/2)+(I_y/2)$], and a collector current of the transistor Q406 is expressed as [$(I_0/2)-(I_y/2)$], where $I_y$ is a collector current generated by the input voltage $V_y$.

An output current $I^+$ is derived from the coupled collectors of the transistors Q401 and Q403, and another output current $I^-$ is derived from the coupled collectors of the transistors Q402 and Q404. A differential output current $\Delta I$ of the Gilbert multiplier cell containing the multiplication result is obtained by the difference of the two output currents, i.e., $\Delta I = I^+ - I^-$.

When the Gilbert multiplier cell of FIG. 4 is used as a mixer circuit, an input signal is applied to the coupled bases of the transistors Q401 and Q404 and those of the transistors Q402 and Q403, and at the same time, a local signal is applied across the bases of the transistors Q405 and Q406. In this case, the non-linearity of the input signal tends to cause the third-order distortion in mixer characteristics.

Therefore, the linearity of the voltage-current converter, which is formed by the transistors Q405 and Q406 driven by the constant current sink, needs to be improved.

Additionally, in the Gilbert multiplier cell in FIG. 5, the differential output current $\Delta I$ is expressed as $$\Delta I = I^+ - I^- = I_0[\tanh(V_x/2V_T) \cdot \tanh(V_y/2V_T)].$$

When $V_x \leq V_T$ and $V_y \leq V_T$, the differential output current $\Delta I$ is approximated as $$\Delta I \approx I_0[(V_x/2V_T) \cdot (V_y/2V_T)].$$

An OTA is an essential, basic function block in analog signal applications. Recently, fabrication processes for large-scale integrated circuit devices (LSIs) have been becoming finer and finer and as a result, the supply voltage for the LSIs has been decreasing from 5 V to 3 V, or lower. This tendency has been increasing the necessity for the low-voltage circuit technique more and more.

Also, the above-described conventional OTAs of FIGS. 1 to 4 are capable of low-voltage operation at approximately 3 or 2 V when the input voltage range providing the linear operation is 1 V peak-to-peak (i.e., 1 $V_{P-P}$). However, they have the various problem described previously.

SUMMARY OF THE INVENTION

Accordingly, an object of the present invention is to provide an OTA capable of completely linear operation within the entire operable input range.

Another object of the present invention is to provide an OTA capable of operation at a power supply voltage as low as approximately 1.9 V for the input voltage range of approximately 1 V peak-to-peak or greater.

Still another object of the present invention is to provide an OTA which causes no S/N degradation due to the compression and expansion of an input signal.

A further object of the present invention is to provide a multiplier capable of completely linear operation within the entire operable input range for at least one of two input signals to be multiplied.

The above objects together with others not specifically mentioned will become clear to those skilled in the art from the following description.

According to a first aspect of the present invention, an OTA is provided.

This OTA includes a differential pair of first and second bipolar transistors, a first current source/sink for driving the first transistor, a second current source/sink for driving the second transistor, and a resistor connected to an emitter of the first transistor and an emitter of the second transistor.

The emitters of the first and second transistors are coupled together through the resistor.

The differential pair has a pair of input terminals of the OTA.

The OTA according to the first aspect further includes a first current mirror having an input terminal and an output terminal and a second current mirror having an input terminal and an output terminal. The input terminal of the first current mirror is connected to the first transistor. The input terminal of the second current mirror is connected to the second transistor.

The output terminal of the first current mirror and the output terminal of the second current mirror form a pair of output terminals of the OTA.

An input signal to be amplified is differentially applied across the pair of input terminals of the OTA. An amplified output signal is differentially derived from the pair of output terminals of the OTA.

With the OTA according to the first aspect of the present invention, the first and second transistors constituting the differential pair are respectively driven by the first and second constant current sources/sinks. Therefore, the voltage applied across the resistor can be equal to the input signal voltage, which means that the resistor is equivalent to a "floating resistor".

Also, the current flowing through the resistor is taken out with the use of the first and second current mirrors, without logarithmic compression nor exponential expansion.

As a result, a completely or perfectly linear amplification operation can be obtained within a specific voltage range of the input signal with a simple circuit configuration.

Further, because the amplified output signal is derived through said first and second current mirrors, no logarithmic compression nor exponential expansion is required. This means that no S/N degradation occurs.

No circuit for logarithmic compression and exponential expansion is required and therefore, the necessary power supply voltage can be decreased. Thus, the amplifier according to the first aspect is operable at a low supply voltage such as approximately 1.9 V.

According to a second aspect of the present invention, another OTA is provided, which is equivalent to one obtained by replacing each bipolar transistor with an MOSFET.

This OTA includes a differential pair of first and second MOSFETs, a first current source/sink for driving the first MOSFET, a second current source/sink for driving the second MOSFET, and a resistor connected to a source of the first MOSFET and a source of the second MOSFET.

The sources of the first and second transistors are coupled together through the resistor.

The differential pair has a pair of input terminals of the OTA.

The OTA according to the second aspect further includes a first current mirror having an input terminal and an output terminal and a second current mirror having an input terminal and an output terminal. The input terminal of the first current mirror is connected to the first transistor. The input terminal of the second current mirror is connected to the second MOSFET.

The output terminal of the first current mirror and the output terminal of the second current mirror form a pair of output terminals of the OTA.

An input signal to be amplified is differentially applied across the pair of input terminals of the OTA. An amplified output signal is differentially derived from the pair of output terminals of the OTA.

With the OTA according to the second aspect of the present invention, because of the same reason, the same advantages can be realized.

In a preferred embodiment of the OTA according to the first and second aspect, each of the first and second current mirrors includes an emitter follower bipolar transistor.

According to a third aspect of the present invention, a multiplier is provided, which is equivalent to one obtained by replacing the differential pair serving as the V-I converter with the linear gain cell according to the first or second aspect.

This multiplier includes a first differential pair of first and second bipolar transistors whose emitters are coupled together, a second differential pair of third and fourth bipolar transistors whose emitters are coupled together, and a linear gain cell having first and second input terminals and first and second output terminals.

The coupled emitters of the first and second transistors are connected to the first output terminal of the cell. The coupled emitters of the third and fourth transistors are connected to the second output terminal of the cell.

Bases of the first and fourth transistors are coupled together to form a first input terminal of the multiplier. Bases of the second and third transistors are coupled together to form a second input terminal of the multiplier.

Collectors of the first and third transistors are coupled together to form a first output terminal of the multiplier. Collectors of the second and fourth transistors are coupled together to form a second output terminal of the multiplier.

A first input signal is applied across the first and second input terminals of the multiplier.

A second input signal is applied across the first and second input terminals of the cell.

An output signal having the multiplication result of the first and second input signals is differentially derived from the first and second output terminals of the multiplier.

As the cell, the OTA according to the first or second aspect is preferably used.

With the multiplier according to the third aspect, since the linear gain cell according to the first or second aspect is used as the differential pair serving as the V-I converter in the Gilbert multiplier cell, the completely linear operation can be obtained with respect to the second input signal.

In a preferred embodiment of the multiplier according to the third aspect, a converter circuit with an arc hyperbolic tangent ($\tanh^{-1}$) transfer characteristic is additionally provided. The first input signal is applied across the first and second input terminals of the multiplier through the $\tanh^{-1}$ converter circuit.

In this case, since the $\tanh^{-1}$ converter circuit compensates the hyperbolic tangent (tanh) characteristic of the first and second differential pairs, the multiplication operation becomes linear with respect to the first input signal. Thus, the complete linear operation can be realized with respect to both of the first and second input signals.

It is preferred that the $\tanh^{-1}$ converter circuit has a third differential pair of fifth and sixth bipolar transistors whose bases are coupled together, and a second linear gain cell. The second linear gain cell has third and fourth input terminals across which the second input signal is applied, and third and fourth output terminals to which emitters of the fifth and sixth transistors are respectively connected.

As the second linear gain cell, the OTA according to the first or second aspect is used.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
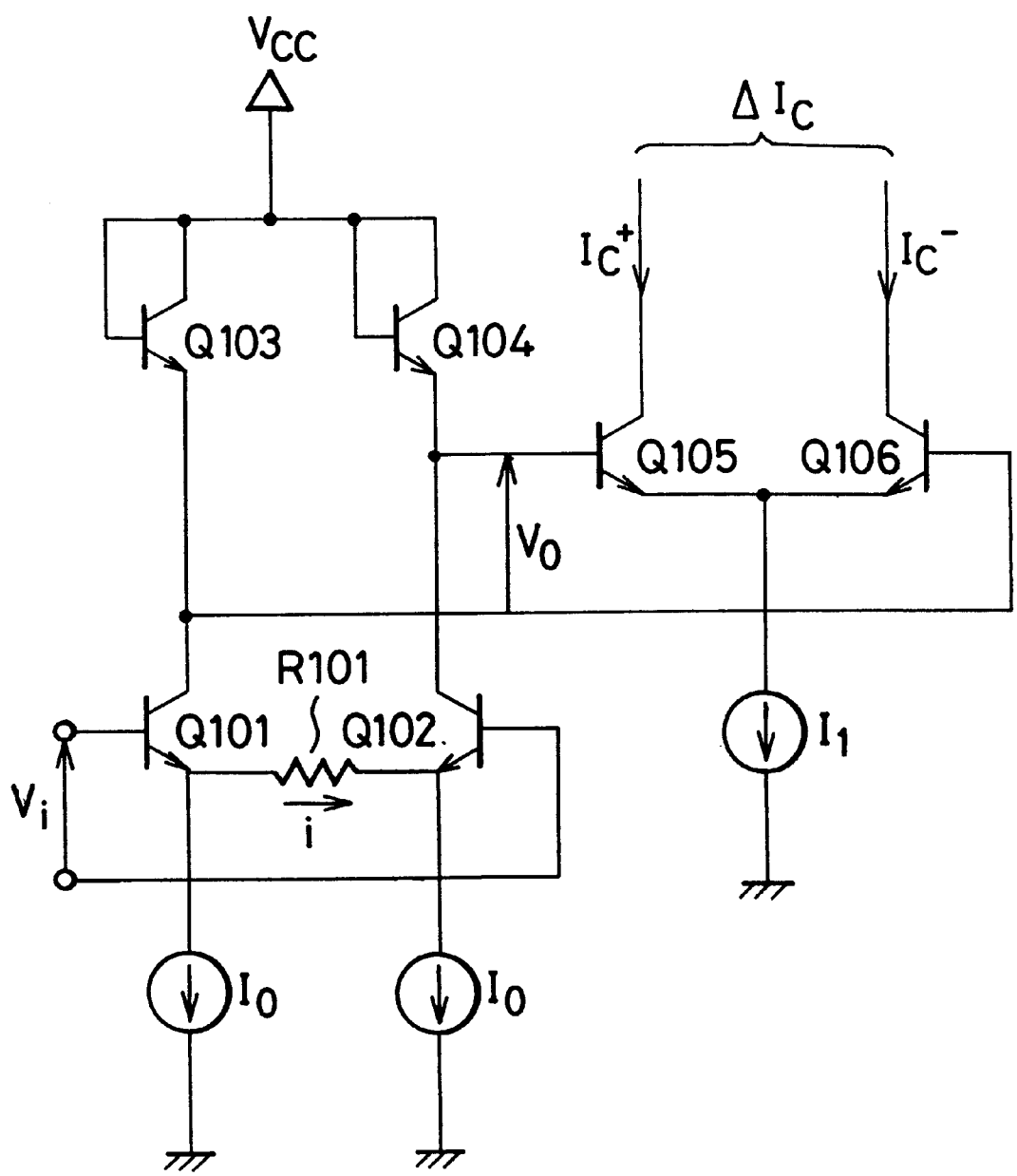
FIG. 1 is a circuit diagram of a first example of the conventional bipolar OTAs.
Figure 2:
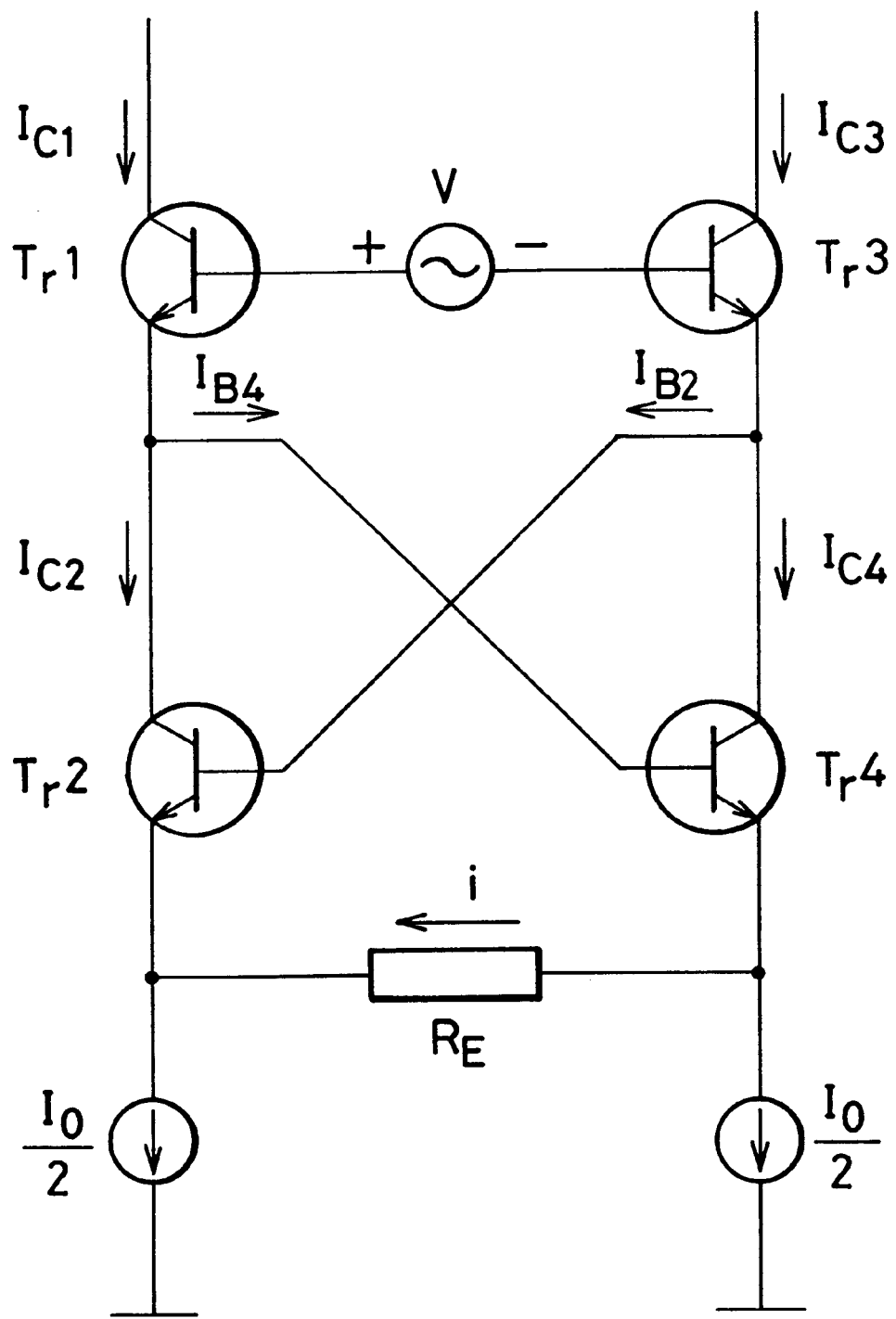
FIG. 2 is a circuit diagram of a second example of the conventional bipolar OTAs.
Figure 3:
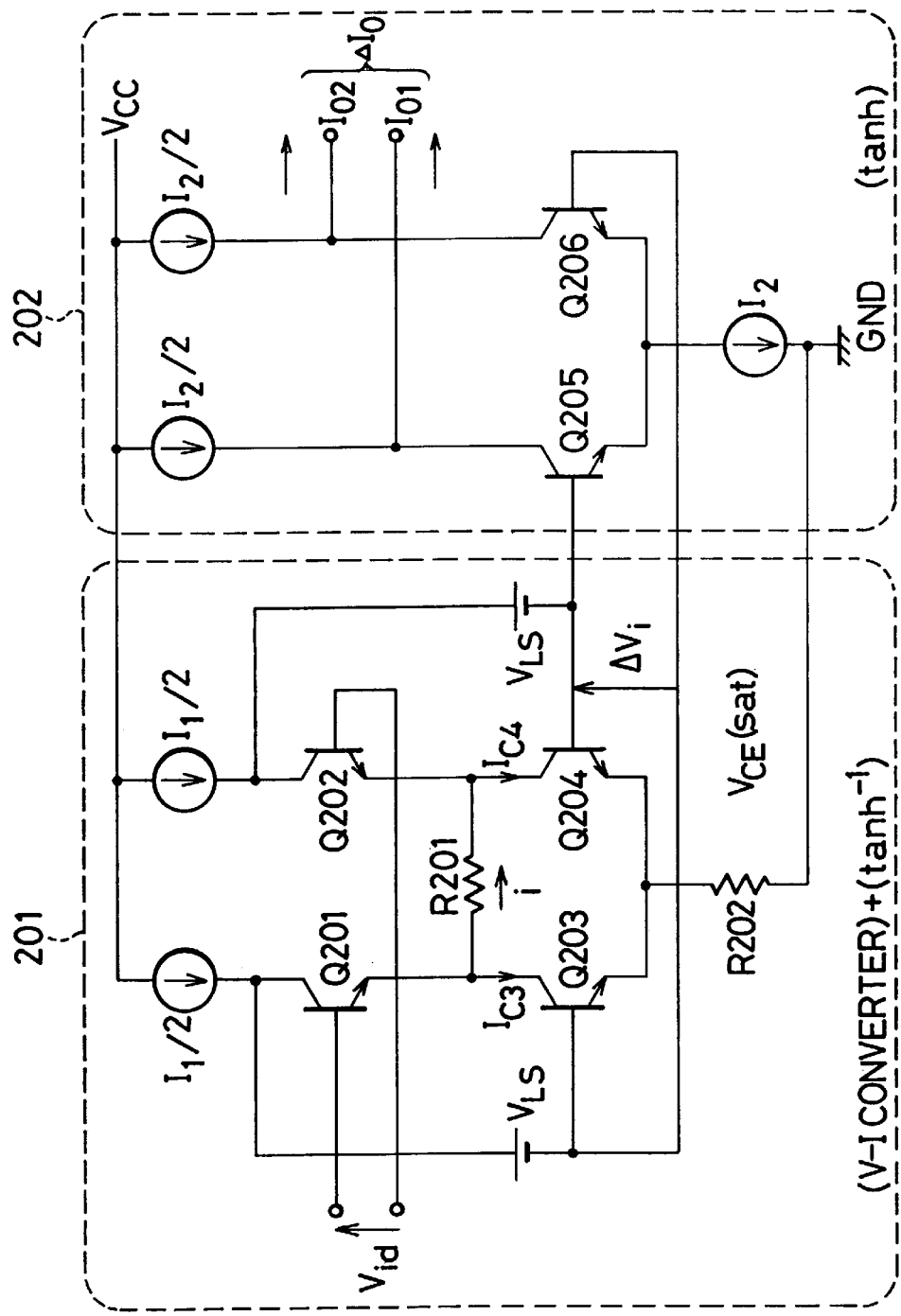
FIG. 3 is a circuit diagram of a third example of the conventional bipolar OTAs.
Figure 4:
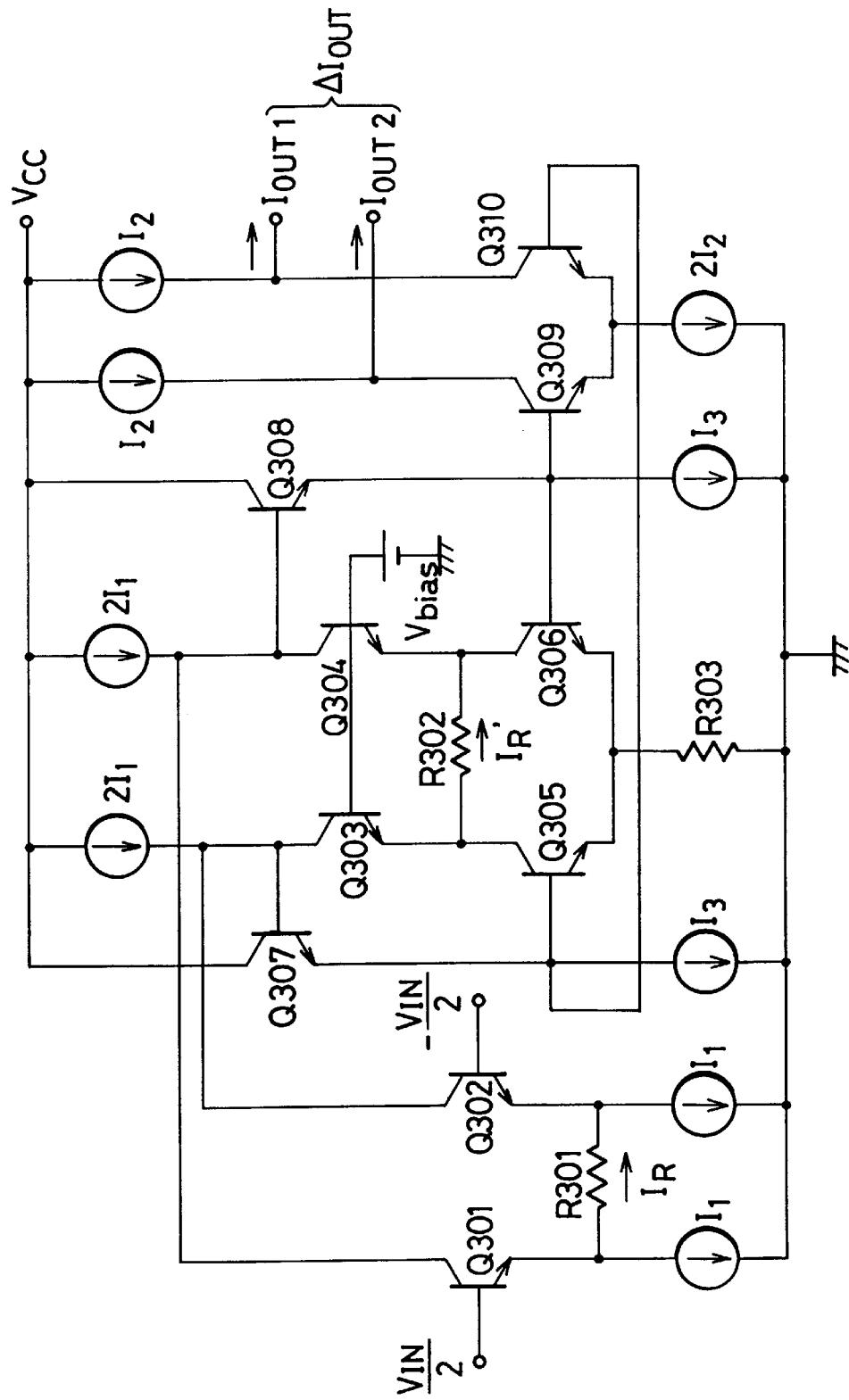
FIG. 4 is a circuit diagram of a fourth example of the conventional bipolar OTAs.

Preferred embodiments of the present invention will be described in detail below while referring to the drawings attached.

FIRST EMBODIMENT

Figure 6:
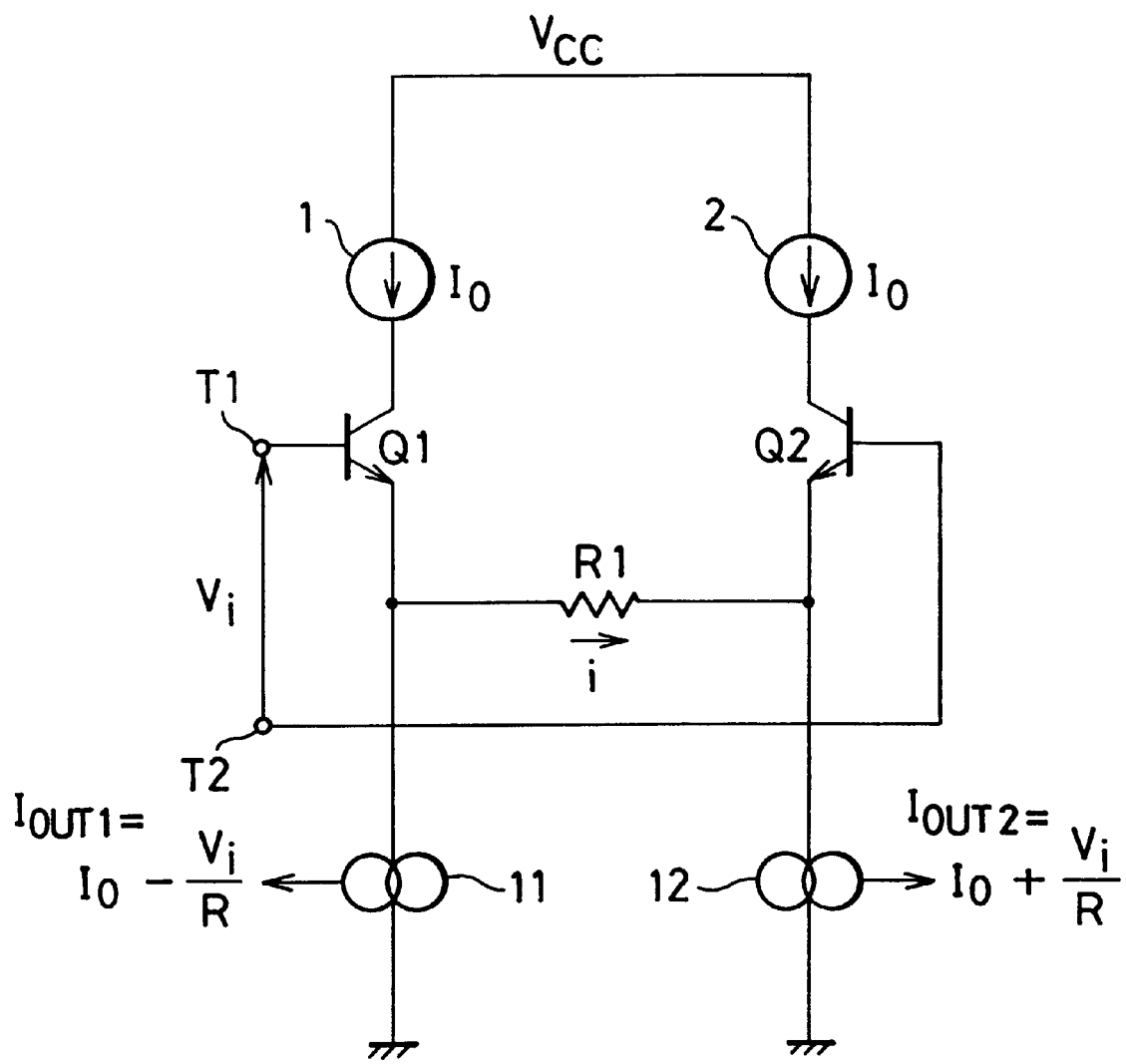
FIG. 6 is a circuit diagram of a bipolar OTA according to a first embodiment of the present invention.

A bipolar OTA according to a first embodiment is shown in FIG. 6. As shown in FIG. 6, this OTA includes a balanced differential pair of npn bipolar transistors Q1 and Q2 whose emitter areas are equal to each other.

Emitters of the transistors Q1 and Q2 are coupled together through an emitter resistor R1 having a resistance R. The emitter of the transistor Q1 is further connected to the ground through a current mirror 11. The emitter of the transistor Q2 is further connected to the ground through a current mirror 12.

The current mirrors 11 and 12 serve as active loads of the transistors Q1 and Q2, respectively. Output currents of the OTA are derived from the current mirrors 11 and 12, respectively.

A collector of the transistor Q1 is applied with a power supply voltage $V_{CC}$ through a constant current source 1 supplying a constant current $I_0$. The transistor Q1 is driven by the constant current $I_0$.

A collector of the transistor Q2 is applied with the same power supply voltage $V_{CC}$ through a constant current source 2 supplying the same constant current $I_0$. The transistor Q2 is driven by the constant current $I_0$.

A base of the transistor Q1 is connected to an input terminal T1 and a base of the transistor Q2 is connected to another input terminal T2. A differential input voltage $V_i$ is applied across the input terminals T1 and T2.

A current i will flow through the emitter resistor R1 according to the value of the differential input voltage $V_i$.

With the OTA according to the first embodiment, since the transistors Q1 and Q2 are driven by the same constant current $I_0$, the base-to-emitter voltages $V_{BE1}$ and $V_{BE2}$ are equal to each other. Therefore, in the same way as that shown in the first conventional OTA, the following equation (19) is established.

$$V_i = Ri \quad (19)$$

Accordingly, the current i is expressed as $$i = \frac{V_i}{R} \quad (20)$$

Thus, the output currents $I_{OUT1}$ and $I_{OUT2}$ outputted from the current mirror circuits 11 and 12 are given by the following expressions (21a) and (21)b, respectively.

$$I_{OUT1} = I_0 - i = I_0 - \frac{V_i}{R} \quad (21a)$$

$$I_{OUT2} = I_0 + i = I_0 + \frac{V_i}{R} \quad (21b)$$

It is seen from the equations (21a) and (21b) that the emitter resistor R1 serves as a floating resistor.

Figure 7:
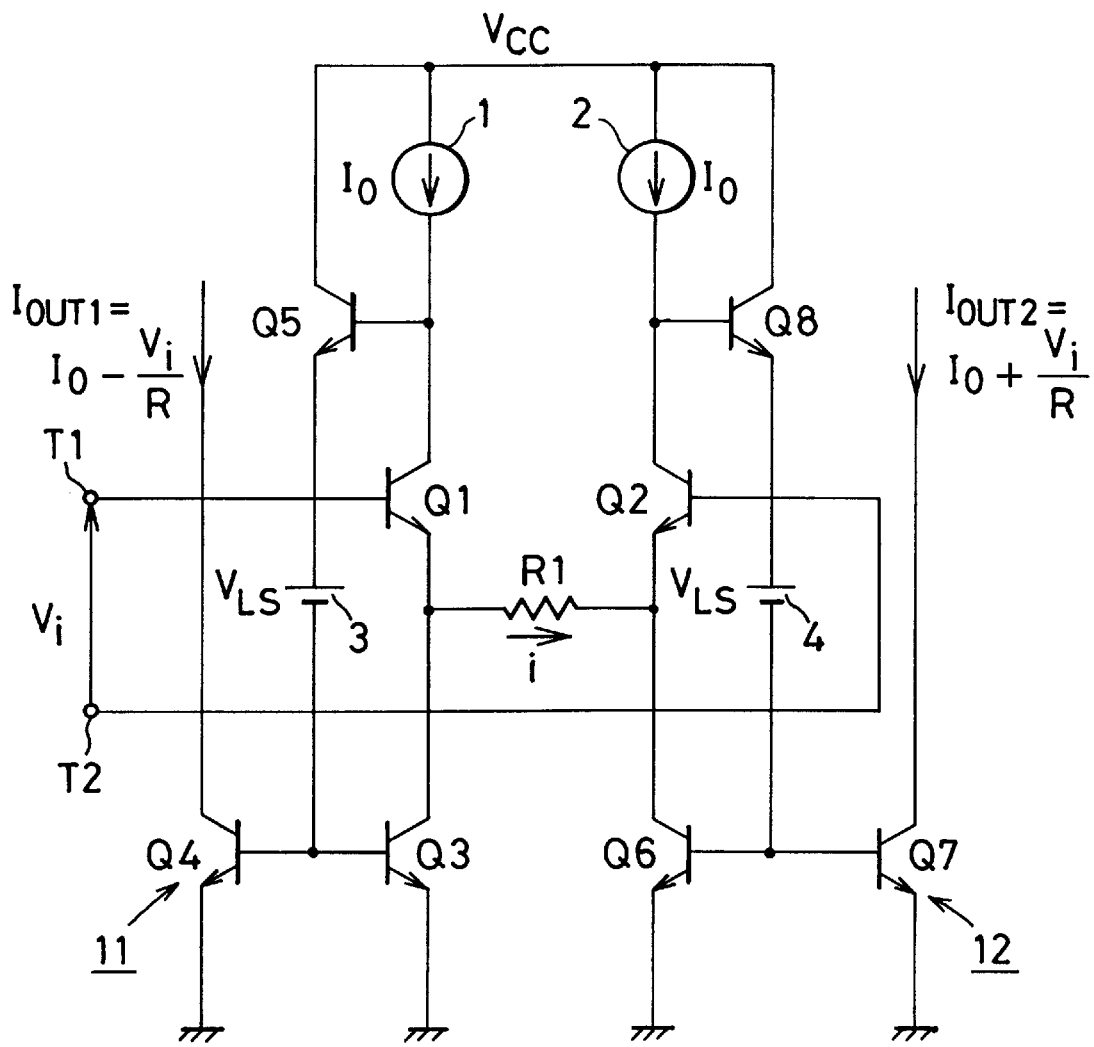
FIG. 7 is a circuit diagram of the bipolar OTA according to the first embodiment, in which the "emitter-follower-augmented current mirrors" are used as the respective current mirrors.

FIG. 7 shows a detailed configuration of the bipolar OTA according to the first embodiment. In FIG. 7, each of the current mirrors 11 and 12 in FIG. 6 is a type of an emitter-follower-augmented current mirror.

Specifically, the current mirror 11 is comprised of two npn bipolar transistors Q3 and Q4 whose bases are coupled together, and an npn bipolar transistor Q5 serving as an emitter-follower transistor, and a constant voltage source 3 supplying a constant voltage $V_{LS}$.

A collector of the transistor Q3 is connected to the emitter of the transistor Q1. An emitter of the transistor Q3 is connected to the ground. The coupled bases of the transistors Q3 and Q4 are connected to a negative electrode of the voltage source 3. An emitter of the transistor Q4 is connected to the ground. A base of the transistor Q5 is connected to the collector of the transistor Q1. A collector of the transistor Q5 is applied with the power supply voltage $V_{CC}$. An emitter of the transistor Q5 is connected to the positive electrode of the voltage source 3. The output current $I_{OUT1}=I_0-(V_i/R)$ is derived from a collector of the transistor Q4. The constant voltage source 3 serves to shift the voltage level at the coupled bases of the transistors Q3 and Q4.

Similarly, the current mirror 12 is comprised of two npn bipolar transistors Q6 and Q7 whose bases are coupled together, and an npn bipolar transistor Q8 serving as an emitter-follower transistor, and a constant voltage source 4 supplying the same constant voltage $V_{LS}$ as that of the voltage source 3.

A collector of the transistor Q6 is connected to the emitter of the transistor Q2. An emitter of the transistor Q6 is connected to the ground. The coupled bases of the transistors Q6 and Q7 are connected to a negative electrode of the voltage source 4. An emitter of the transistor Q7 is connected to the ground. A base of the transistor Q8 is connected to the collector of the transistor Q2. A collector of the transistor Q8 is applied with the power supply voltage $V_{CC}$. An emitter of the transistor Q8 is connected to the positive electrode of the voltage source 4. The output current $I_{OUT2}=I_0+(V_i/R)$ is derived from a collector of the transistor Q7. The constant voltage source 4 serves to shift the voltage level at the coupled bases of the transistors Q6 and Q7.

With the OTA according to the first embodiment of FIG. 7, the transistors Q1 and Q2 constituting the differential pair are respectively driven by the corresponding constant current sources 1 and 2, respectively. Therefore, the voltage applied across the resistor R1 can be equal to the input signal voltage $V_i$, which means that the resistor R1 is equivalent to a "floating resistor".

Also, the current i flowing through the resistor R1 is taken out with the use of the current mirrors 11 and 12, without logarithmic compression nor exponential expansion.

As a result, a completely or perfectly linear amplification operation can be obtained within a specific voltage range of the input signal $V_i$ with a simple circuit configuration.

Further, because the amplified output signals $I_{OUT1}$ and $I_{OUT2}$ are derived through the corresponding current mirrors 11 and 12, respectively, no logarithmic compression nor exponential expansion is required. This means that no S/N degradation occurs.

No circuit for logarithmic compression and exponential expansion is required and therefore, the necessary power supply voltage $V_{cc}$ can be decreased. Thus, the amplifier according to the first embodiment of FIG. 7 is operable at a low supply voltage such as approximately 1.9 V.

In the bipolar OTA according to the first embodiment, the linearity of the OTA operation is determined by the resistance linearity of the emitter resistor R1.

Figure 8:
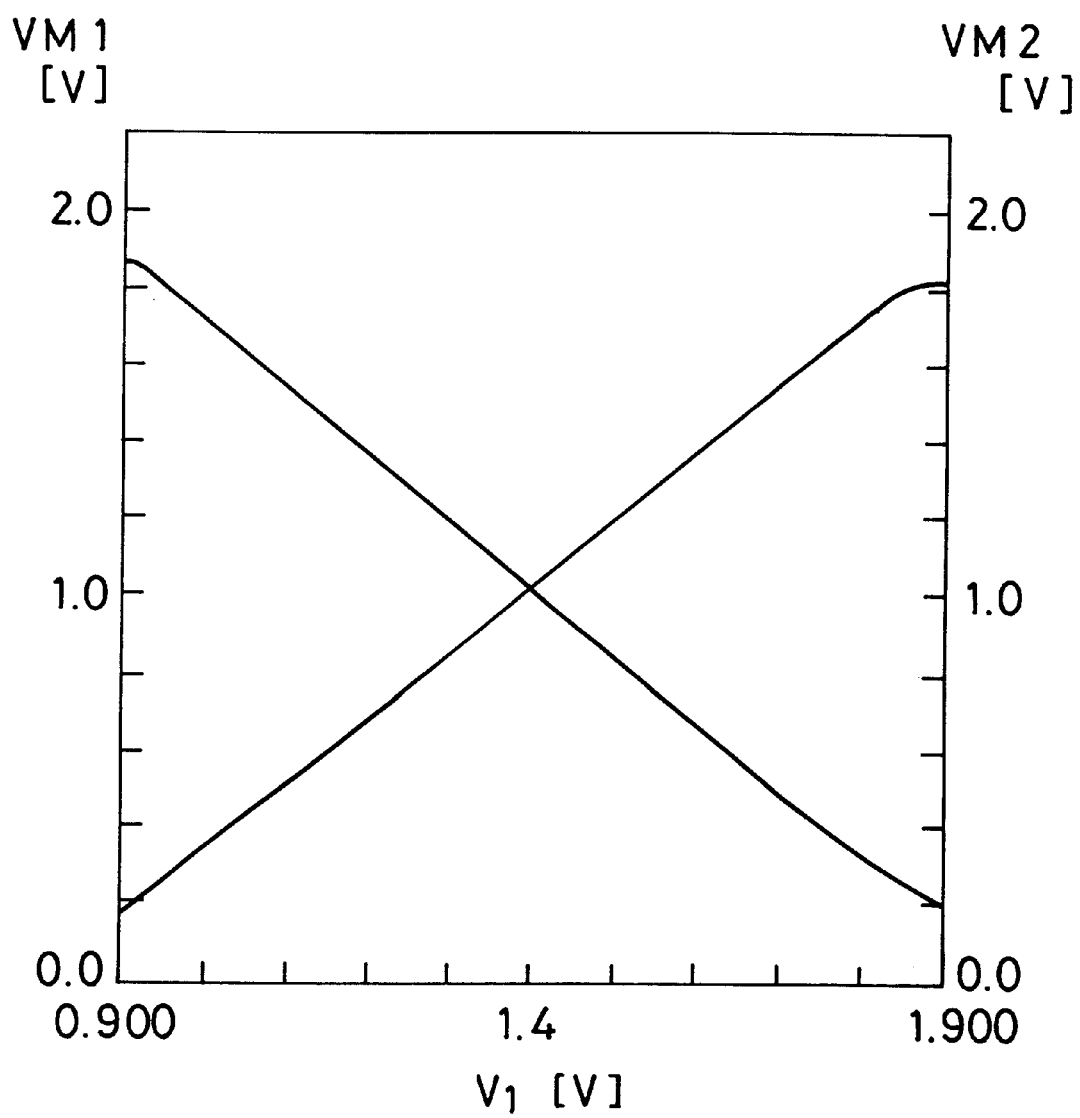
FIG. 8 is a graph showing the measured dc transfer characteristics of the bipolar OTA according to the first embodiment.

FIG. 8 shows the dc transfer (V-I) characteristics of the bipolar OTA according to the first embodiment.

Figure 13:
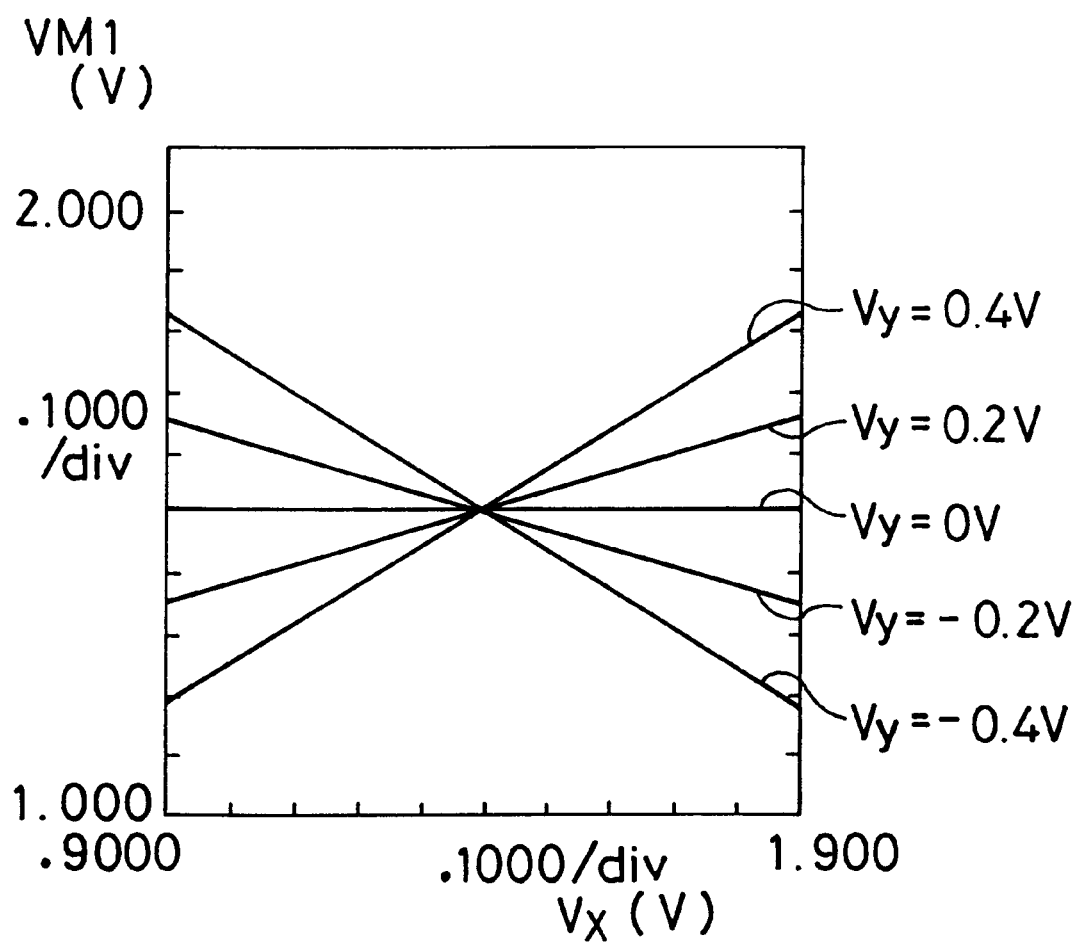
FIG. 13 is a graph showing the measured dc transfer characteristics of the bipolar OTA according to the first embodiment.
Figure 14:
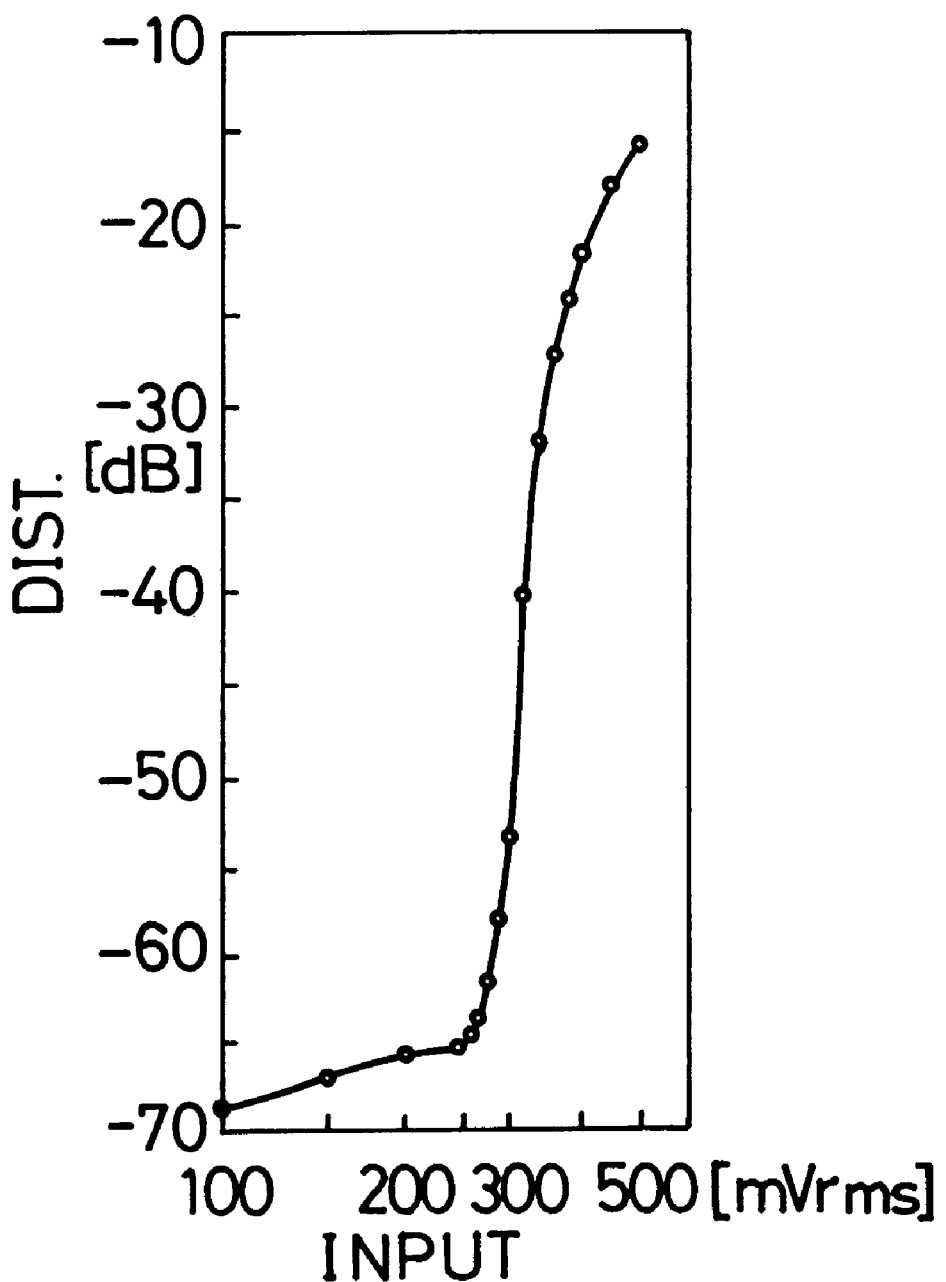
FIG. 14 is a graph showing the measured THD characteristics of the bipolar OTA according to the first embodiment, when an input frequency is 1 kHz.

FIG. 13 shows the measured dc transfer (V-I) characteristics of the bipolar OTA according to the first embodiment, in which the differential output current of the OTA is indicated in voltage. FIG. 14 shows the measured THD characteristics thereof, when an input frequency is 1 kHz. These characteristics in FIGS. 13 and 14 were obtained by inventor's tests. The testing condition is as follows.

The power supply voltage $V_{CC}$ is 1.9V, the driving current $I_0$ is 50 $\mu$A, the resistance of the resistor R1 is 10 k$\Omega$, the load resistance is 18 k$\Omega$. A voltage of 1.4V is applied to the input terminal T2 as a reference voltage, and a voltage of 0.9 to 1.9 V is applied to the input terminal T1.

It is seen from FIGS. 13 and 14 that the linear input voltage range is approximately equal to 1 $V_{P-P}$, and that the obtained linear input voltage range is 320 m$V_{rms}$ (=0.905 $V_{P-P}$) for less than 1 percent total harmonic distortion (THD), or 285 m$V_{rms}$ (=0.806 $V_{P-P}$) for less than 0.1 percent THD, when the input frequency is 1 kHz.

SECOND EMBODIMENT

Figure 9:
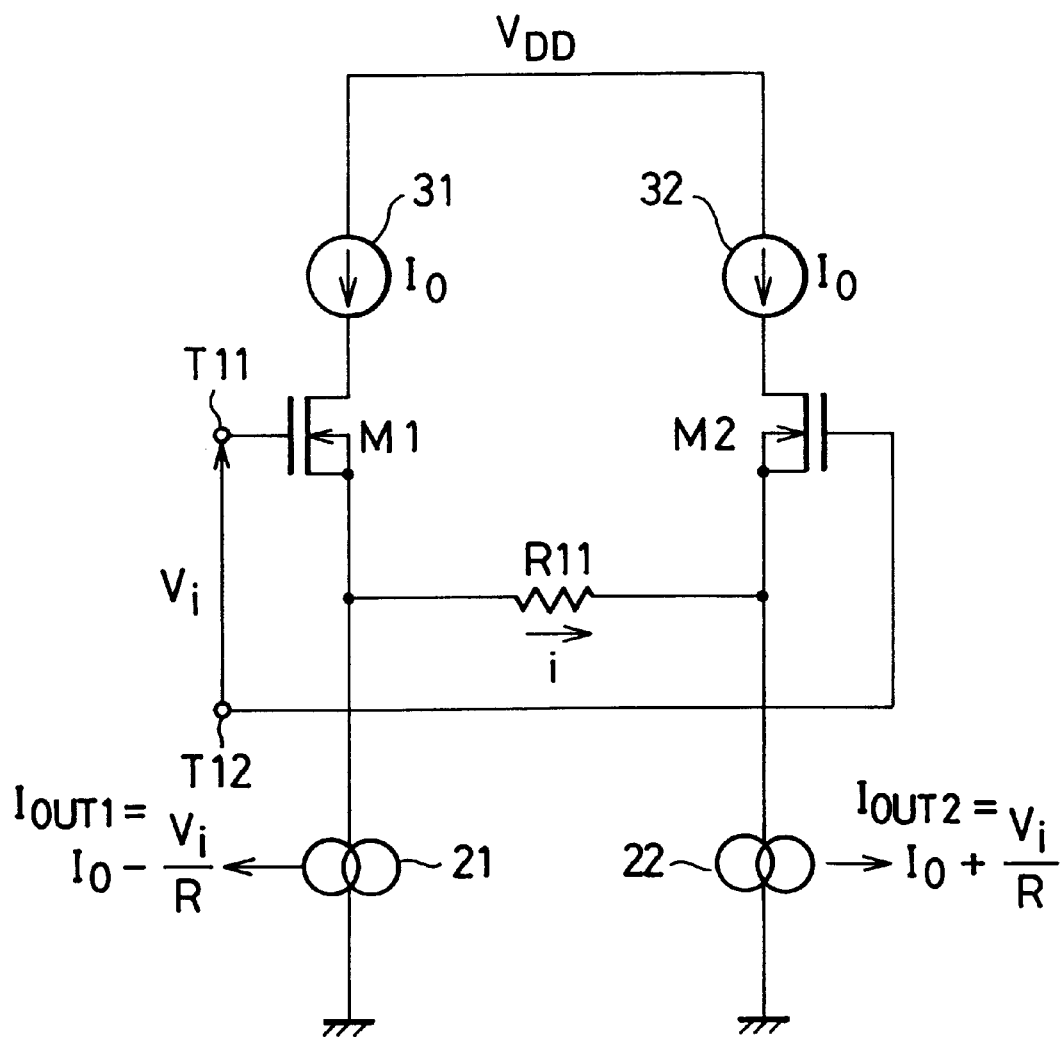
FIG. 9 is a circuit diagram of a MOS OTA according to a second embodiment of the present invention, which is equivalent to one obtained by replacing the bipolar transistors with MOSFETs in the OTA of FIG. 6.

AMOS multiplier according to a second embodiment of the present invention is shown in FIG. 9.

As shown in FIG. 9, this OTA includes a balanced differential pair of n-channel MOSFETs M1 and M2 whose transconductance parameters β are equal to each other. Sources of the MOSFETs M1 and M2 are coupled together through a first resistor R11 having a resistance R.

Here, β is defined as $$\beta = \frac{\mu C_{OX}}{2} \cdot \frac{W}{L}$$

where $\mu$ is the mobility of a carrier, $C_{ox}$ is the gate-oxide capacitance per unit area, and W and L are a gate width and a gate length of each MOSFET, respectively.

Sources of the MOSFETs M1 and M2 are coupled together through a source resistor R11 having a resistance R. The source of the MOSFET M1 is further connected to the ground through a current mirror 21. The source of the MOSFET M2 is further connected to the ground through a current mirror 22.

The current mirrors 21 and 22 serve as active loads of the MOSFETs M1 and M2, respectively. Output currents $I_{OUT1}$ and $I_{OUT2}$ of the OTA are derived from the current mirrors 21 and 22, respectively.

A drain of the MOSFET M1 is applied with a power supply voltage $V_{DD}$ through a constant current source 31 supplying a constant current $I_0$. The MOSFET M1 is driven by the constant current $I_0$.

A drain of the MOSFET M2 is applied with the same power supply voltage $V_{DD}$ through a constant current source 32 supplying the same constant current $I_0$. The MOSFET M2 is driven by the same constant current $I_0$.

A gate of the MOSFET M1 is connected to an input terminal T11 and a gate of the MOSFET M2 is connected to another input terminal T12. A differential input voltage $V_i$ is applied across the input terminals T11 and T12.

A current i will flow through the source resistor R11 according to the value of the differential input voltage $V_i$.

With the OTA according to the second embodiment, since the MOSFETs M1 and M2 are driven by the same constant current $I_0$, the gate-to-source voltages $V_{GS1}$ and $V_{GS2}$ are equal to each other. Therefore, in the same way as that shown in the first conventional OTA, the above equations (19), (20), (21a) and (21b) are established.

Unlike the first embodiment, these equations (19), (20), (21a) and (21b) are given without any approximation, because no gate current flows in each MOSFET. This means that the linearity of the MOS OTA according to the second embodiment is determined by the resistance linearity of the source resistor R11.

Figure 10:
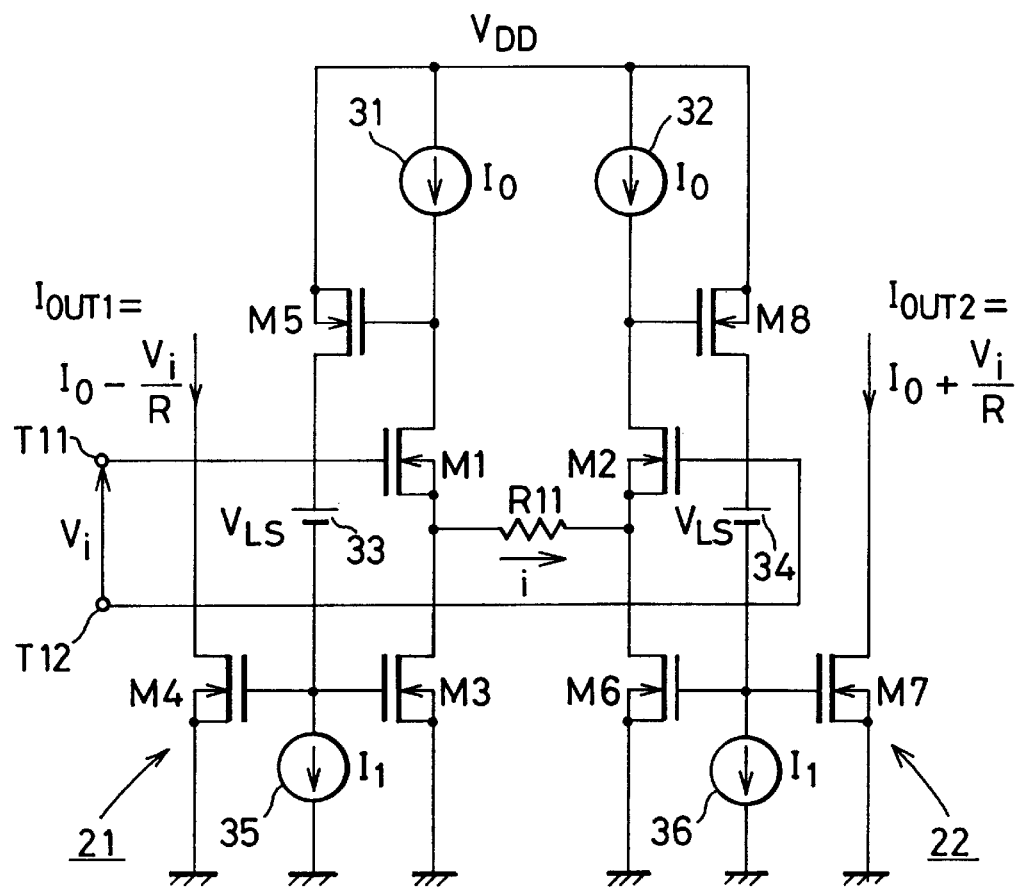
FIG. 10 is a circuit diagram of a MOS OTA according to the second embodiment, which is equivalent to one obtained by replacing the bipolar transistors with MOSFETs in the OTA of FIG. 7.

FIG. 10 shows a detailed configuration of the MOS OTA according to the second embodiment. In FIG. 10, each of the current mirrors 21 and 22 in FIG. 9 is a type of a source-follower-augmented current mirror.

Specifically, the current mirror 21 is comprised of two n-channel MOSFETs M3 and M4 whose gates are coupled together, and an n-channel MOSFET M5 serving as a source-follower MOSFET, and a constant voltage source 33 supplying a constant voltage $V_{LS}$.

A drain of the MOSFET M3 is connected to the source of the MOSFET M1. A source of the MOSFET M3 is connected to the ground. The coupled gates of the MOSFETs M3 and M4 are connected to a negative electrode of the voltage source 33. A source of the MOSFET M4 is connected to the ground. A gate of the MOSFET M5 is connected to the drain of the MOSFET M1. A drain of the MOSFET M5 is applied with the power supply voltage $V_{DD}$. A source of the MOSFET M5 is connected to the positive electrode of the voltage source 33. The output current $I_{OUT1} = I_0 - (V_i/R)$ is derived from a drain of the MOSFET M4. The constant voltage source 33 serves to shift the voltage level at the coupled gates of the MOSFETs M3 and M4.

Similarly, the current mirror 22 is comprised of two n-channel MOSFETs M6 and M7 whose gates are coupled together, and an n-channel MOSFET M8 serving as a source-follower MOSFET, and a constant voltage source 34 supplying the same constant voltage $V_{LS}$ as that of the voltage source 33.

A drain of the MOSFET M6 is connected to the source of the MOSFET M2. A source of the MOSFET M6 is connected to the ground. The coupled gates of the MOSFETs M6 and M7 are connected to a negative electrode of the voltage source 34. A source of the MOSFET M7 is connected to the ground. A gate of the MOSFET M8 is connected to the drain of the MOSFET M2. A drain of the MOSFET M8 is applied with the power supply voltage $V_{DD}$. A source of the MOSFET M8 is connected to the positive electrode of the voltage source 34. The output current $I_{OUT2} = I_0 + (V_i/R)$ is derived from a drain of the MOSFET M7. The constant voltage source 4 serves to shift the voltage level at the coupled gates of the MOSFET Q6 and Q7.

With the OTA according to the second embodiment of FIG. 10, the MOSFETs M1 and M2 constituting the differential pair are respectively driven by the corresponding constant current sources 31 and 32, respectively. Therefore, the voltage applied across the resistor R11 can be equal to the input signal voltage $V_i$, which means that the resistor R11 is equivalent to a "floating resistor".

Also, the current i flowing through the resistor R11 is taken out with the use of the current mirrors 31 and 32, without logarithmic compression nor exponential expansion.

As a result, a completely or perfectly linear amplification operation can be obtained within a specific voltage range of the input signal $V_i$ with a simple circuit configuration.

Further, because the amplified output signals $I_{OUT1}$ and $I_{OUT2}$ are derived through the corresponding current mirrors 21 and 22, respectively, no logarithmic compression nor exponential expansion is required. This means that no S/N degradation occurs.

No circuit for logarithmic compression and exponential expansion is required and therefore, the necessary power supply voltage $V_{DD}$ can be decreased. Thus, the OTA according to the second embodiment of FIG. 10 is operable at a low supply voltage such as approximately 1.9 V.

THIRD EMBODIMENT

Figure 5:
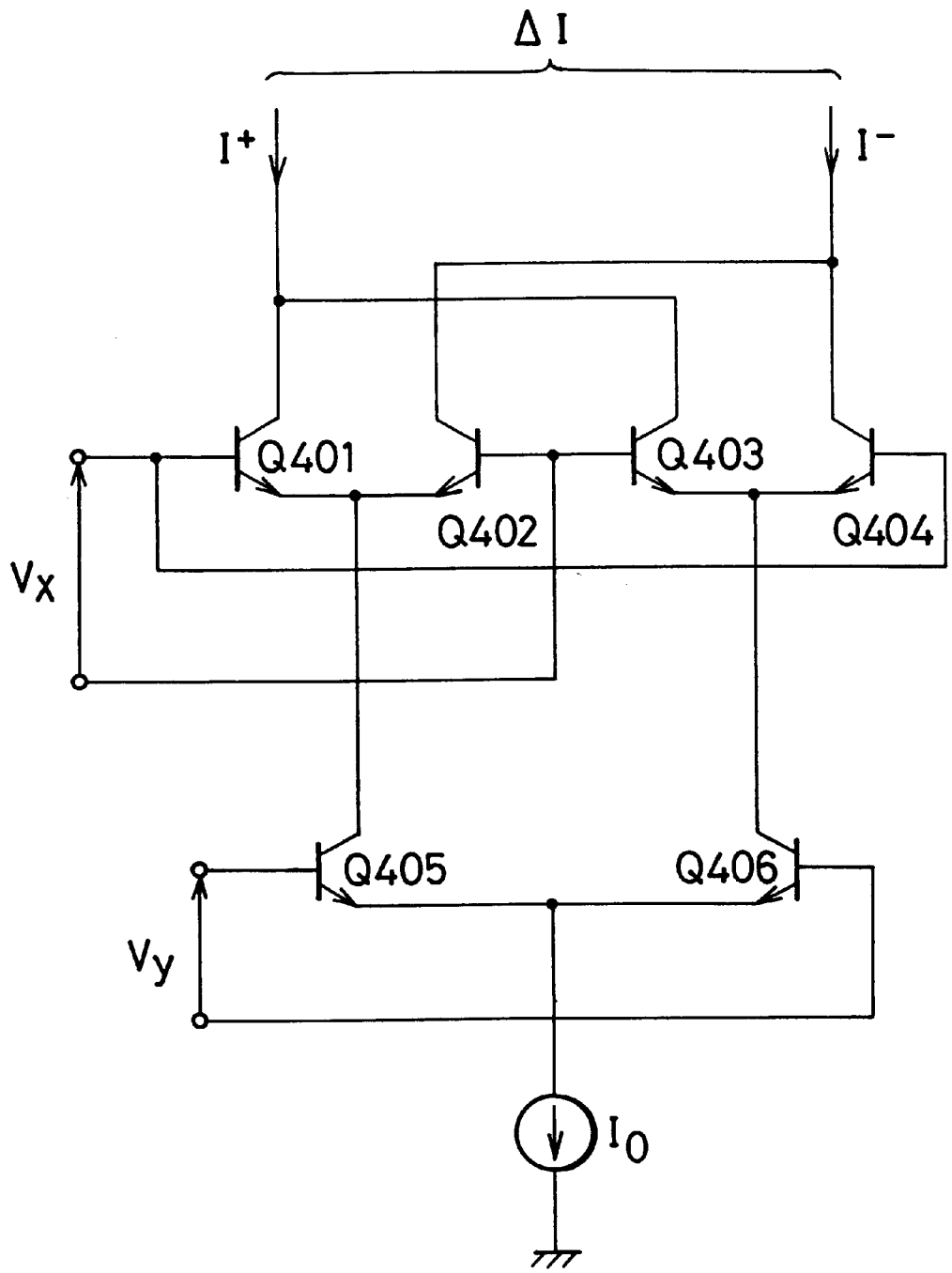
FIG. 5 is a circuit diagram of a well-known Gilbert multiplier cell.
Figure 11:
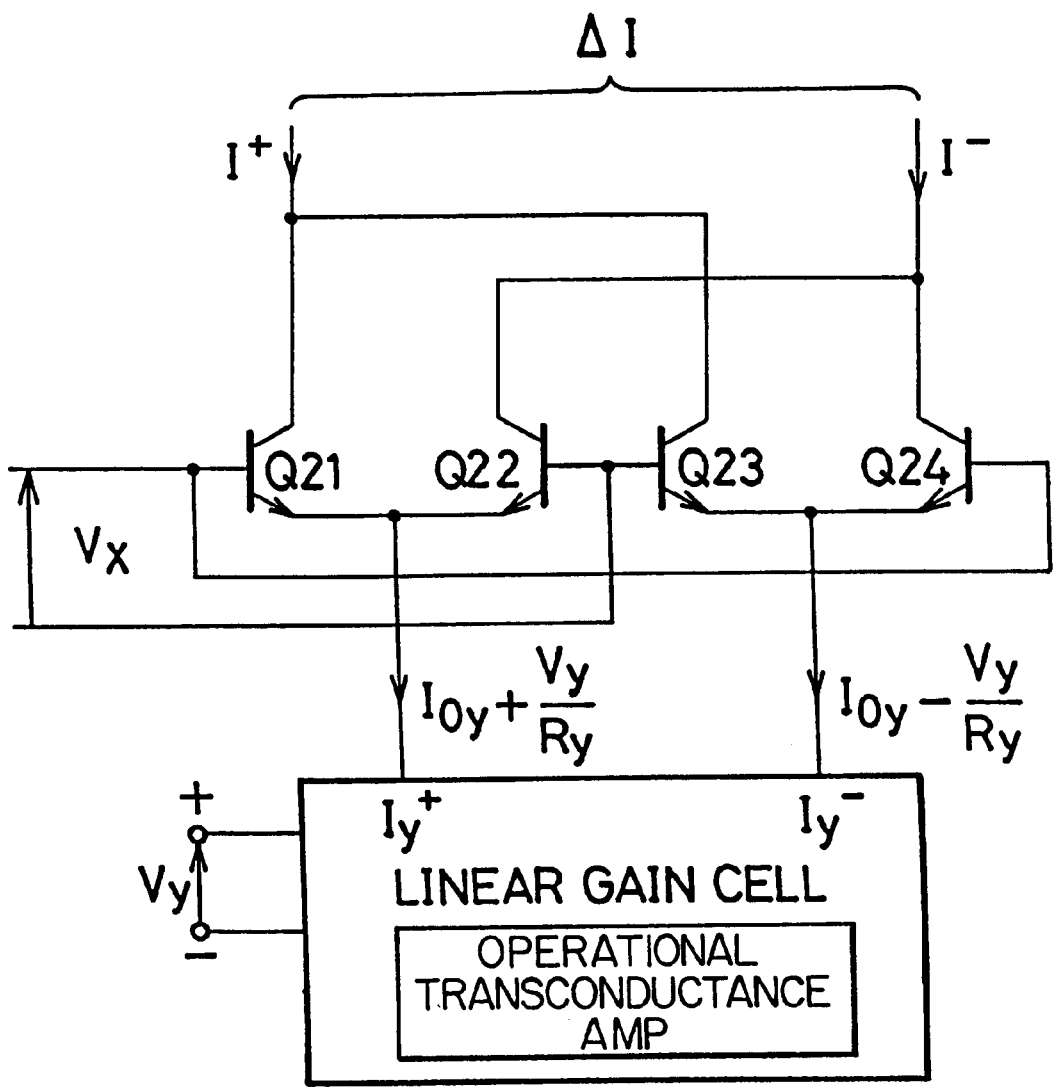
FIG. 11 is a circuit diagram of a bipolar multiplier according to a third embodiment of the present invention.

A bipolar multiplier according to a third embodiment of the present invention is shown in FIG. 11, which corresponds to one obtained by replacing the V-I converter (which is composed of the transistors Q405 and Q406) with the OTA according to the first embodiment of FIGS. 6 and 7 in the Gilbert multiplier cell of FIG. 5.

In FIG. 11, npn bipolar transistors Q21 and Q22 form a first emitter-coupled differential pair, and npn bipolar transistors Q23 and Q24 form a second emitter-coupled differential pair.

Bases of the transistors Q21 and Q24 are coupled together to form a first input terminal of the multiplier. Bases of the transistors Q22 and Q23 are also coupled together to form a second input terminal of the multiplier. A first input signal voltage $V_x$ is applied across the first and second input terminals of the multiplier.

Collectors of the transistors Q21 and Q23 are coupled together to form a first output terminal of the multiplier.

Collectors of the transistors Q22 and Q24 are coupled together to form a second output terminal of the multiplier. An output current ΔI is differentially derived from the first and second output terminals of the multiplier.

A linear gain cell 62 is composed of the bipolar OTA according to the first embodiment of FIG. 7. The cell 62 has first and second input terminals to be applied with a second input signal voltage $V_y$. The first and second input terminals correspond to the input terminals T1 and T2 (i.e., the bases of the transistors Q1 and Q2) in FIG. 7, respectively.

The cell 62 further has first and second output terminals. The first output terminal is connected to the coupled emitters of the transistors Q21 and Q22. The second output terminal is connected to the coupled emitters of the transistors Q23 and Q24. The first and second output terminals correspond to the collectors of the transistors Q4 and Q7 in FIG. 7, respectively.

The differential output current ΔI of the cross-coupled, emitter-coupled pairs of the transistors Q21, Q22, Q23, and Q24, (i.e., the multiplier in FIG. 11) is expressed as the following equation (22).

$$\Delta I = (I_y^+ - I_y^-)\tanh\left(\frac{V_x}{2V_T}\right) \tag{22}$$

where $I_y^+$ and $I_y^-$ are output currents of the linear gain cell 62, which correspond to the output currents $I_{OUT1}$ and $I_{OUT2}$ in FIG. 7.

The output currents $I_y^+$ and $I_y^-$ of the linear gain cell 62 are given by the following expressions (23) and (24)

$$I_y^+ = I_{0y} + \frac{V_y}{R_y} \tag{23}$$

$$I_y^- = I_{0y} - \frac{V_y}{R_y} \tag{24}$$

where $I_{0y}$ is the constant driving current of the constant current sources 1 and 2 in FIG. 7, and $R_y$ is the resistance of the emitter resistor R1 in FIG. 7.

From the equations (23) and (24), the following expression is obtained as $$I_y^+ - I_y^- = \frac{2V_y}{R_y} \tag{25}$$

Therefore, the differential output current ΔI is expressed as the following equation (26).

$$\Delta I = \frac{2V_y}{R_y}\tanh\left(\frac{V_x}{2V_T}\right) \tag{26}$$

It is seen from the equation (26) that the four-quadrant linear multiplication behavior can be realized with respect to the second input signal voltage Vy only.

As described above, with the multiplier according to the third embodiment, the linear gain cell 62 according to the first embodiment is used as the differential pair serving as the V-I converter in the Gilbert multiplier cell of FIG. 5. As a result, the completely linear operation can be obtained with respect to the second input signal voltage $V_y$.

FOURTH EMBODIMENT

Figure 12:
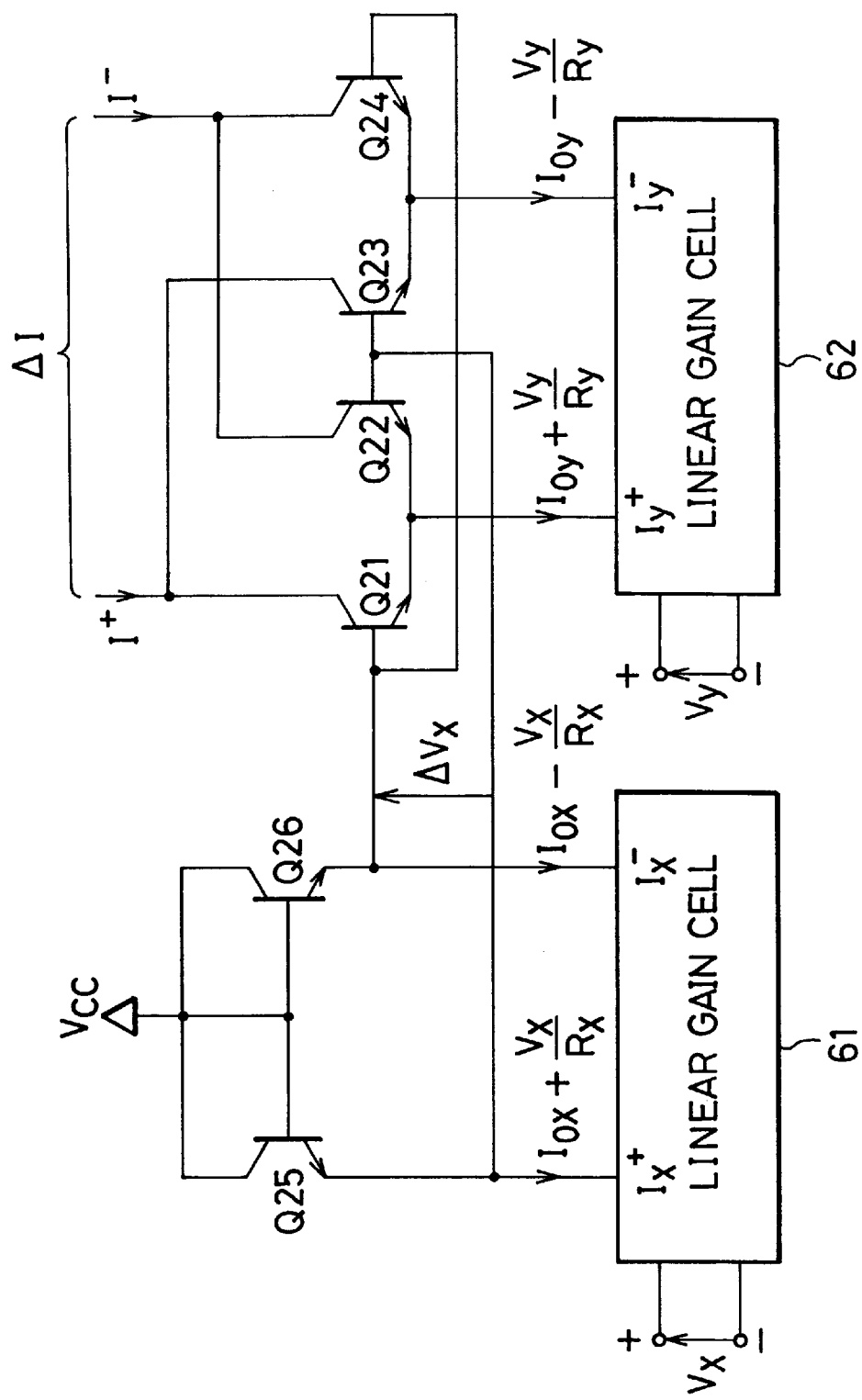
FIG. 12 is a circuit diagram of a bipolar multiplier according to a fourth embodiment of the present invention.

A bipolar multiplier according to a fourth embodiment of the present invention is shown in FIG. 12, which corresponds to one obtained by adding a converter circuit with an arc hyperbolic tangent (tanh$^{-1}$) characteristic to the bipolar multiplier 11 according to the third embodiment of FIG. 11.

The tanh$^{-1}$ converter circuit has a third differential pair of bipolar transistors Q25 and Q26 whose bases are coupled together, and a second linear gain cell 61.

The first input signal voltage $V_x$ is applied across the first and second input terminals of the multiplier through the tanh$^{-1}$ converter circuit.

With the bipolar multiplier according to the fourth embodiment, the tanh$^{-1}$ converter circuit compensates the hyperbolic tangent (tanh) characteristic of the cross-coupled, emitter-coupled pairs made of the transistors Q21, Q22, Q23, and Q24. As a result, the multiplication behavior becomes completely linear with respect to the first input signal $V_x$.

Thus, the complete linear multiplication operation can be realized with respect to both of the first and second input signals $V_x$ and $V_y$.

In the converter circuit, the following equations (27) and (28) are established.

$$I_x^+ = I_{0x} + \frac{V_x}{R_x} = I_S \exp\left(\frac{V_{BE5}}{V_T}\right) \tag{27}$$

$$I_x^- = I_{0x} - \frac{V_x}{R_x} = I_S \exp\left(\frac{V_{BE6}}{V_T}\right) \tag{28}$$

where $V_{BE5}$ and $V_{BE6}$ are the base-to-emitter voltages of the transistors Q25 and Q26, respectively.

Accordingly, the differential output voltage $\Delta V_x$ of the converter is given by the following equation (29).

$$\Delta V_x = V_{BE6} - V_{BE5} = V_T \ln\left(\frac{I_{0x} + \frac{V_x}{R_x}}{I_{0x} - \frac{V_x}{R_x}}\right) \tag{29}$$

On the other hand, the differential output current ΔI is expressed as the following equation (30) when the converter is not added.

It is seen from the equation (30) that the differential output current,ΔI is proportional to the hyperbolic tangent (tanh) of the differential input voltage $\Delta V_x$ when the converter is not added.

$$\Delta I = (I_y^+ - I_y^-)\tanh\left(\frac{\Delta V_x}{2V_T}\right) \tag{30}$$

$$= (I_y^+ - I_y^-)\tanh\left\{\frac{1}{2}\ln\left(\frac{\frac{I_{0x} + V_x}{R_x}}{\frac{I_{0x} - V_x}{R_x}}\right)\right\}$$

$$= (I_y^+ - I_y^-)\frac{V_x}{I_{0x}R_x}$$

The equation (30) is obtained using the following relationships (31) and (32).

$$\tanh^{-1}z = \frac{1}{2}\ln\left(\frac{1+z}{1-z}\right) \tag{31}$$

-continued $$z = \frac{V_x}{I_{0x}R_x} \qquad (32)$$

With the multiplier according to the fourth embodiment of FIG. 12, since the tanh$^{-1}$ converter is additionally provided, the hyperbolic tangent (tanh) characteristic of the cross-coupled, emitter-coupled pairs of the transistors Q21, Q22, Q23, and Q24 can be compensated. Accordingly, the operation becomes linear with respect to the first input signal voltage $V_x$.

Thus, the complete linear operation can be realized with respect to both of the first and second input signals $V_x$ and $V_y$. This means that the four-quadrant multiplier capable of complete linear operation can be realized.

The differential output current $\Delta I$ of the multiplier according to the fourth embodiment is given by the following expression (33).

$$\Delta I = \frac{2V_xV_y}{I_{0x}R_xR_y} \qquad (33)$$

FIG. 13 shows the dc transfer (V-I) characteristics of the bipolar multiplier according to the fourth embodiment, which was obtained by the inventor's tests, in which the differential output current of the multiplier is indicated in voltage. The testing condition is as follows.

The power supply voltage $V_{CC}$ is 1.9V, the driving current $I_0$ is 50 $\mu$A, the resistance of the emitter resistor R1 is 10 k$\Omega$, and the load resistance is 8.2 k$\Omega$. A voltage of 1.4V is applied to the input terminal T2 as a reference voltage, and a voltage of 0.9 to 1.9 V is applied to the input terminal T1. The second input voltage $V_y$, which is used as a parameter, is 0, ±200 mV, and ±400 mV.

It is seen from FIG. 13 that the linear input voltage range is approximately equal to 1 $V_{P-P}$.

The bipolar OTA according to the first embodiment of FIG. 7 is used as the linear gain cells 61 and/or 62 in the multipliers according to the third and fourth embodiments. However, the MOS OTA according to the second embodiment of FIG. 10 may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:
   (a) a differential pair of first and second bipolar transistors; said differential pair having a pair of input terminals of said amplifier;
   (b) a first current source/sink for driving said first transistor;
   said first current source/sink being connected to a collector of said first transistor;
   (c) a second current source/sink for driving said second transistor;
   said second current source/sink being connected to a collector of said second transistor;
   (d) a resistor connected to an emitter of said first transistor and an emitter of said second transistor;
   (e) said emitters of said first and second transistors being coupled together through said resistor;
   (f) a first current mirror having an input terminal and an output terminal;
   said input terminal of said first current mirror being connected to said emitter of said first transistor;
   (g) a second current mirror having an input terminal and an output terminal;
   said input terminal of said second current mirror being connected to said emitter of said second transistor; and (h) said output terminal of said first current mirror and said output terminal of said second current mirror forming a pair of output terminals of said amplifier, respectively;
   wherein an input signal to be amplified is differentially applied across said pair of input terminals of said amplifier; and
   wherein an amplifier output signal is derived from said pair of output terminals of said amplifier.

2. An operational transconductance amplifier comprising:
   (a) a differential pair of first and second bipolar transistors;
   said differential pair having a pair of input terminals of said amplifier;
   (b) a first current source/sink for driving said first transistor;
   (c) a second current source/sink for driving said second transistor;
   (d) a resistor connected to an emitter of said first transistor and an emitter of said second transistor;
   (e) said emitters of said first and second transistors being coupled together through said resistor;
   (f) a first current mirror having an input terminal and an output terminal;
   said input terminal of said first current mirror being connected to said first transistor;
   (g) a second current mirror having an input terminal and an output terminal;
   said input terminal of said second current mirror being connected to said second transistor; and
   (h) said output terminal of said first current mirror and said output terminal of said second current mirror forming a pair of output terminals of said amplifier, respectively;
   wherein an input signal to be amplified is differentially applied across said pair of input terminals of said amplifier;
   and wherein an amplifier output signal is derived from said pair of output terminals of said amplifier; and
   wherein each of said first and second current mirrors includes an emitter follower bipolar transistor.

3. An operational transconductance amplifier comprising:
   (a) a differential pair of first and second bipolar transistors;
   said differential pair having a pair of input terminals of said amplifier;
   (b) a first current source/sink for driving said first transistor;
   (c) a second current source/sink for driving said second transistor;
   (d) a resistor connected to an emitter of said first transistor and an emitter of said second transistor;
   (e) said emitters of said first and second transistors being coupled together through said resistor;
   (f) a first current mirror having an input terminal and an output terminal;
   said input terminal of said first current mirror being connected to said first transistor;

(g) a second current mirror having an input terminal and an output terminal;
said input terminal of said second current mirror being connected to said second transistor; and
(h) said output terminal of said first current mirror and said output terminal of said second current mirror forming a pair of output terminals of said amplifier, respectively;
wherein an input signal to be amplified is differentially applied across said pair of input terminals of said amplifier;
and wherein an amplifier output signal is derived from said pair of output terminals of said amplifier; and
wherein said first current source/sink is connected to a collector of said first transistor, and said second current source/sink is connected to a collector of said second transistor;
and wherein said first current mirror is connected to said emitter of said first transistor, and said second current mirror is connected to said emitter of said second transistor.

4. An operational transconductance amplifier comprising:
(a) a differential pair of first and second MOSFETs; said differential pair having a pair of input terminals of said amplifier;
(b) a first current source/sink for driving said first MOSFET;
said first current source/sink being connected to a drain of said first MOSFET;
(c) a second current source/sink for driving said second MOSFET;
said second current source/sink being connected to a drain of said second MOSFET;
(d) a resistor connected to a source of said first MOSFET and a source of said second MOSFET;
(e) said sources of said first and second transistors being coupled together through said resistor;
(f) a first current mirror having an input terminal and an output terminal; said input terminal of said first current mirror being connected to said source of said first MOSFET;
(g) a second current mirror having an input terminal and an output terminal;
said input terminal of said second current mirror being connected to said source of said second MOSFET; and
(h) said output terminal of said first current mirror and said output terminal of said second current mirror forming a pair of output terminals of said amplifier;
wherein an input signal to be amplified is differentially applied across said pair of input terminals of said amplifier;
and wherein an amplified output signal is differentially derived from said pair of output terminals of said amplifier.

5. An operational transconductance amplifier comprising:
(a) a differential pair of first and second MOSFETs;
said differential pair having a pair of input terminals of said amplifier;
(b) a first current source/sink for driving said first MOSFET;
(c) a second current source/sink for driving said second MOSFET;
(d) a resistor connected to a source of said first MOSFET and a source of said second MOSFET;
(e) said sources of said first and second transistors being coupled together through said resistor;
(f) a first current mirror having an input terminal and an output terminal;
said input terminal of said first current mirror being connected to said first MOSFET;
(g) a second current mirror having an input terminal and an output terminal;
said input terminal of said second current mirror being connected to said second MOSFET; and
(h) said output terminal of said first current mirror and said output terminal of said second current mirror forming a pair of output terminals of said amplifier;
wherein an input signal to be amplified is differentially applied across said pair of input terminals of said amplifier;
and wherein an amplified output signal is differentially derived from said pair of output terminals of said amplifier; wherein each of said first and second current mirrors includes a source follower MOSFET.

6. An operational transconductance amplifier comprising:
(a) a differential pair of first and second MOSFETs;
said differential pair having a pair of input terminals of said amplifier;
(b) a first current source/sink for driving said first MOSFET;
(c) a second current source/sink for driving said second MOSFET;
(d) a resistor connected to a source of said first MOSFET and a source of said second MOSFET;
(e) said sources of said first and second transistors being coupled together through said resistor;
(f) a first current mirror having an input terminal and an output terminal;
said input terminal of said first current mirror being connected to said first MOSFET;
(g) a second current mirror having an input terminal and an output terminal;
said input terminal of said second current mirror being connected to said second MOSFET; and
(h) said output terminal of said first current mirror and said output terminal of said second current mirror forming a pair of output terminals of said amplifier;
wherein an input signal to be amplified is differentially applied across said pair of input terminals of said amplifier;
and wherein an amplified output signal is differentially derived from said pair of output terminals of said amplifier;
wherein said first current source/sink is connected to a drain of said first MOSFET, and said second current source/sink is connected to a drain of said second MOSFET;
and wherein said first current mirror is connected to said source of said first MOSFET, and said second current mirror is connected to said source of said second MOSFET.

7. A multiplier comprising:
(a) a first differential pair of first and second bipolar transistors whose emitters are coupled together;
(b) a second differential pair of third and fourth bipolar transistors whose emitters are coupled together;
(c) a linear gain cell having first and second input terminals and first and second output terminals;
(d) said coupled emitters of said first and second transistors being connected to said first output terminal of said cell;

(e) said coupled emitters of said third and fourth transistors are connected to said second output terminal of said cell;

(f) bases of said first and fourth transistors being coupled together to form a first input terminal of said multiplier;

(g) bases of said second and third transistors being coupled together to form a second input terminal of said multiplier;

(h) collectors of said first and third transistors being coupled together to form a first output terminal of said multiplier;

(i) collectors of said second and fourth transistors being coupled together to form a second output terminal of said multiplier;

(j) a first input signal being applied across said first and second input terminals of said multiplier; and (k) a second input signal being applied across said first and second input terminals of said cell;

wherein an output signal having the multiplication result of said first and second input signals is differentially derived from said first and second output terminals of said multiplier; wherein said linear gain cell includes an operational transconductance amplifier;

said operational transconductance amplifier comprising:

(a) a differential pair of fifth and sixth bipolar transistors;

said differential pair of fifth and sixth bipolar transistors having a pair of input terminals of said amplifier;

(b) a first current source/sink for driving said fifth transistor;

(c) a second current source/sink for driving said sixth transistor;

(d) a resistor connected to an emitter of said fifth transistor and an emitter of said sixth transistor;

(e) said emitters of said fifth and sixth transistors being coupled together through said resistor;

(f) a first current mirror having an input terminal and an output terminal;

said input terminal of said first current mirror being connected to said fifth transistor;

(g) a second current mirror having an input terminal and an output terminal;

said input terminal of said second current mirror being connected to said sixth transistor; and (h) said output terminal of said first current mirror and said output terminal of said second current mirror forming a pair of output terminals of said amplifier, respectively;

wherein an input signal to be amplified is differentially applied across said pair of input terminals for said amplifier;

and wherein an amplifier output signal is derived from said pair of output terminals of said amplifier.

8. A multiplier comprising:

(a) a first differential pair of first and second bipolar transistors whose emitters are coupled together;

(b) a second differential pair of third and fourth bipolar transistors whose emitters are coupled together;

(c) a linear gain cell having first and second input terminals and first and second output terminals;

(d) said coupled emitters of said first and second transistors being connected to said first output terminal of said cell;

(e) said coupled emitters of said third and fourth transistors are connected to said second output terminal of said cell;

(f) bases of said first and fourth transistors being coupled together to form a first input terminal of said multiplier;

(g) bases of said second and third transistors being coupled together to form a second input terminal of said multiplier;

(h) collectors of said first and third transistors being coupled together to form a first output terminal of said multiplier;

(i) collectors of said second and fourth transistors being coupled together to form a second output terminal of said multiplier;

(j) a first input signal being applied across said first and second input terminals of said multiplier; and (k) a second input signal being applied across said first and second input terminals of said cell;

wherein an output signal having the multiplication result of said first and second input signals is differentially derived from said first and second output terminals of said multiplier; wherein said linear gain cell includes an operational transconductance amplifier;

said operational transconductance amplifier comprising:

(a) a differential pair of first and second MOSFETs; said differential pair having a pair of input terminals of said amplifier;

(b) a first current source/sink for driving said first MOSFET;

(c) a second current source/sink for driving said second MOSFET;

(d) a resistor connected to a source of said first MOSFET and a source of said second MOSFET;

(e) said sources of said first and second transistors being coupled together through said resistor;

(f) a first current mirror having an input terminal and an output terminal;

said input terminal of said first current mirror being connected to said first MOSFET;

(g) a second current mirror having an input terminal and an output terminal;

said input terminal of said second current mirror being connected to said second MOSFET; and (h) said output terminal of said first current mirror and said output terminal of said second current mirror forming a pair of output terminals of said amplifier;

wherein an input signal to be amplified is differentially applied across said pair of input terminals of said amplifier;

and wherein an amplified output signal is differentially derived from said pair of output terminals of said amplifier.

9. A multiplier comprising:

(a) a first differential pair of first and second bipolar transistors whose emitters are coupled together;

(b) a second differential pair of third and fourth bipolar transistors whose emitters are coupled together;

(c) a linear gain cell having first and second input terminals and first and second output terminals;

(d) said coupled emitters of said first and second transistors being connected to said first output terminal of said cell;

(e) said coupled emitters of said third and fourth transistors are connected to said second output terminal of said cell;

(f) bases of said first and fourth transistors being coupled together to form a first input terminal of said multiplier;

(g) bases of said second and third transistors being coupled together to form a second input terminal of said multiplier;

(h) collectors of said first and third transistors being coupled together to form a first output terminal of said multiplier;

(i) collectors of said second and fourth transistors being coupled together to form a second output terminal of said multiplier;

(j) a first input signal being applied across said first and second input terminals of said multiplier; and (k) a second input signal being applied across said first and second input terminals of said cell;

wherein an output signal having the multiplication result of said first and second input signals is differentially derived from said first and second output terminals of said multiplier; and (l) a converter circuit with an arc hyperbolic tangent transfer characteristic; and wherein said first input signal is applied across said first and second input terminals of said multiplier through said $\tanh^{-1}$ converter circuit.

10. A multiplier as claimed in claim 9, wherein a $\tanh^{-1}$ converter circuit has a third differential pair of fifth and sixth bipolar transistors whose bases are coupled together, and a second linear gain cell;

and wherein said second linear gain cell has third and fourth input terminals across which said second input signal is applied, and third and fourth output terminals to which emitters of said fifth and sixth transistors are respectively connected.

* * * * *

UNITED STATES PATENT AND TRADEMARK OFFICE
CERTIFICATE OF CORRECTION

PATENT NO. : 6,111,463
DATED : August 29, 2000
INVENTOR(S) : Katsuji Kimura

It is certified that error appears in the above-identified patent and that said Letters Patent is hereby corrected as shown below:

Column 8,
Line 12, equation 16, delete "$i_R$" insert -- $i_R'$ --;
Line 22, equation 17, delete "$i_R$" insert -- $i_R'$ --;
Line 24, equation 18, delete "$i_R$" insert -- $i_R'$ --.

Colum 24,
Line 19, delete "(i)" insert -- (j) --

Signed and Sealed this

Twenty-sixth Day of February, 2002

Attest:

*Attesting Officer*

JAMES E. ROGAN
*Director of the United States Patent and Trademark Office*